(12) United States Patent
Schmitz et al.

(10) Patent No.: US 10,367,782 B2
(45) Date of Patent: Jul. 30, 2019

(54) SERIAL BUS AUTO-ADDRESSING

(71) Applicant: Elmos Semiconductor AG, Dortmund (DE)

(72) Inventors: Christian Schmitz, Dortmund (DE); Bernd Burchard, Essen (DE)

(73) Assignee: Elmos Semiconductor AG, Dortmund (DE)

( * ) Notice: Subject to any disclaimer, the term of this patent is extended or adjusted under 35 U.S.C. 154(b) by 0 days.

(21) Appl. No.: 16/137,563

(22) Filed: Sep. 21, 2018

(65) Prior Publication Data

US 2019/0173838 A1 Jun. 6, 2019

(30) Foreign Application Priority Data

Dec. 5, 2017 (DE) .......................... 10 2017 128 923
Dec. 28, 2017 (EP) ...................................... 17210861

(51) Int. Cl.
*G06F 3/00* (2006.01)
*H04L 29/12* (2006.01)
(Continued)

(52) U.S. Cl.
CPC .......... *H04L 61/2038* (2013.01); *G01R 1/203* (2013.01); *G06F 13/4282* (2013.01);
(Continued)

(58) Field of Classification Search
CPC . G06F 13/4282; H04L 12/4013; H04L 12/10; H04L 61/2038; H04L 2012/40234;
(Continued)

(56) References Cited

U.S. PATENT DOCUMENTS 5,831,546 A * 11/1998 Costa ................... G08B 25/018
340/9.16
7,590,140 B2 9/2009 Hartzsch
(Continued)

FOREIGN PATENT DOCUMENTS

DE 10 147 512 B4 8/2004
DE 10 256 631 B4 7/2005
(Continued)

OTHER PUBLICATIONS

Elmos: LIN Controller with Position Detection E521.31, Production Data—Oct 6, 2015, URL: http://www.elmos.com/fileadmin/2013/02_products/01_interface/05_lin/e521-31_elmos_ds.pdf (downloaded from the internet on Jan. 30, 2018).

*Primary Examiner* — Jing-Yih Shyu
(74) *Attorney, Agent, or Firm* — Bejin Bieneman PLC

(57) ABSTRACT

A bus node is capable of performing a method, for the assigning of bus node addresses to bus nodes of a serial data bus. The method is performed with the aid of bus shunt resistors in the individual bus nodes of the data bus system in an assignment time period. After the assigning of bus node addresses to the bus nodes in the assignment time period, there follows an operating time period. For this purpose, the bus node comprises such a bus shunt resistor. The bus node is characterized by a bus shunt bypass switch which, prior to assigning a bus node address to the bus node in the assignment time period is opened and which after the assignment of bus node address to the bus node in the assignment time period is closed, and which is closed in the operating time period.

10 Claims, 13 Drawing Sheets

(51) Int. Cl.
*G06F 13/42* (2006.01)
*H04L 12/10* (2006.01)
*H04L 12/40* (2006.01)
*G01R 1/20* (2006.01)

(52) U.S. Cl.
CPC .......... H04L 12/10 (2013.01); H04L 12/4013 (2013.01); H04L 12/40019 (2013.01); H04L 12/40045 (2013.01); H04L 61/2053 (2013.01); *H04L 2012/40234* (2013.01)

(58) Field of Classification Search
CPC ........... H04L 12/40019; H04L 61/2053; H04L 12/40045; G01R 1/203; G01R 12/40019; G01R 12/40045; G01R 12/10; G01R 61/2053; G01R 2012/40234
See application file for complete search history.

(56) References Cited

U.S. PATENT DOCUMENTS

| | | | | |
|---|---|---|---|---|
| 8,122,159 | B2* | 2/2012 | Monreal | G06F 13/4068 710/9 |
| 8,645,580 | B2* | 2/2014 | Koudar | G06F 13/4252 710/3 |
| 8,935,450 | B2* | 1/2015 | Nierop | H04L 12/40045 710/110 |
| 9,331,866 | B2* | 5/2016 | van Dijk | H04L 12/403 |
| 9,558,140 | B2* | 1/2017 | Lambrechts | H04L 61/2038 |
| 2005/0132109 | A1* | 6/2005 | Steger | G06F 13/40 710/104 |
| 2009/0144471 | A1* | 6/2009 | Lin | G06F 13/4252 710/110 |
| 2012/0284441 | A1* | 11/2012 | Landman | G06F 13/4295 710/110 |
| 2013/0059339 | A1* | 3/2013 | Karerangabo | C12M 23/22 435/70.1 |
| 2014/0095749 | A1 | 4/2014 | Lambrechts | |
| 2016/0254925 | A1* | 9/2016 | Riedel | G06F 13/4068 710/110 |
| 2017/0222275 | A1* | 8/2017 | Krishnan | H04L 61/2038 |
| 2018/0083798 | A1* | 3/2018 | Gang | H04L 12/40013 |

FOREIGN PATENT DOCUMENTS

| | | |
|---|---|---|
| DE | 10 2010 026 431 B4 | 6/2012 |
| EP | 1 490 772 B1 | 6/2005 |
| EP | 1 298 851 B1 | 5/2007 |
| EP | 1 603 282 B1 | 9/2008 |
| EP | 2 571 200 A2 | 3/2013 |
| EP | 2 654 246 A2 | 10/2013 |
| WO | 2005 050924 A1 | 6/2005 |

* cited by examiner

SERIAL BUS AUTO-ADDRESSING

CROSS-REFERENCE TO RELATED APPLICATIONS

This application claims priority to German Application no. DE 10 2017 128 923.2 filed on Dec. 5, 2017 and European Application no. EP 17210861.5 filed on Dec. 28, 2017. This application is related to U.S. patent application Ser. No. 16/137,561, filed Sep. 21, 2018 entitled "SERIAL BUS AUTO-ADDRESSING" which claims priority to German Application No. DE 10 2017 122 364.9, filed on Sep. 26, 2017 and European Application EP 17210851.6, filed on Dec. 28, 2017. This application is further related to U.S. patent application Ser. No. 16/137,562, filed Sep. 21, 2018 entitled "SERIAL BUS AUTO-ADDRESSING" which claims priority to German Application no. DE 10 2017 128 489.3, filed on Nov. 30, 2017 and European Application no. EP 17210869.8, filed on Dec. 28, 2017.

INTRODUCTION

The disclosure relates to a method for controlling a serial data bus system and to bus nodes for such a data bus system.

Generally, the disclosure relates to self-test-capable serial data bus systems, and to methods for assigning bus node addresses within this serial data bus comprising a chain of bus nodes, and respectively to methods and devices related to the preparation of the addressing of the bus nodes.

BACKGROUND

From the state of the art, various methods for address assignment in Local Interconnect Network (LIN) bus systems are known. By way of example, reference should be made to the documents DE-B-10 2010 026 431, DE-B-10 147 512, EP-B-1 490 772 and U.S. Pat. No. 9,331,866.

All of these documents have in common that the number of bus nodes which are addressable by the bus master (hereunder referred to as addressable bus nodes) is limited because, in the framework of the auto addressing, each bus node will feed a defined current into the bus. In the one-wire data bus, each addressable bus node has shunt resistors (bus shunts) inserted into it where these currents, while on their way to the bus master—in which, during the address assignment process, a current sink is active—will cause a voltage drop. In the process, the addressable bus nodes arranged closest to the bus master will register a larger voltage drop than the addressable bus nodes arranged at a greater distance from the bus master. The voltage across the bus shunt is compared to a threshold value. If the latter is exceeded, the respective bus node at whose bus shunt this threshold violation takes place, is allowed to assume it is not the last bus node in the chain of the addressable bus nodes as viewed from the bus master. The bus node will then switch off its power source and wait for the next initialization run.

That addressable bus node which is the last bus node in the bus node chain as viewed from the bus master will not switch off its power source. After lapse of a predetermined initialization time, this bus node is allowed to assume it is the last addressable bus node to be addressed in the chain of the addressable bus nodes. It will then take over the bus node address transmitted by the bus master and will not participate in further initialization runs anymore until the received bus node address is declared to be invalid by a reset instruction or another reset condition.

The problem now is that, first, the electrical resistance of the bus shunt should be as small as possible. Second, the largest number possible of addressable bus nodes should be addressable. Third, the addressing system should be capable of working with a negative ground offset. Fourth, the level across the bus shunt has to be maximized, which requires a largest possible addressing current. Fifth, the summated current which has to be taken up by the bus master during the address assignment process is not permitted to exceed a predetermined value, in LIB busses presently 40 mA.

From DE-B-10 2010 026 431, a method is known wherein the individual addressable bus nodes do not work with a constant addressing current as in DE-B-10 147 512 and EP-B-1 490 772 but will increase this addressing current continuously or in a staircase-shaped manner until exceeding the thresholds at the preceding bus nodes. This has several disadvantages: First, in case that there exists a very large number of addressable bus nodes, this will lead to a temporally very long rising time. The time for performing the auto addressing, however, is limited. For this reason, it is necessary to shorten this time up to the addressing of the addressable bus node which is most remote from the bus master and has not been addressed yet. Thus, DE-B-10 2010 026 431 does not entirely solve the problem as to how to be able to address a very large number of addressable bus nodes and to sufficiently lower the resistance value of the bus shunt resistor. Further, the technical teaching disclosed in DE-B-10 2010 026 431 does not lead to a self-testing functionality.

A further disadvantage of DE-B-10 2010 026 431 resides in that, also here, for reasons of robustness, a certain level range has to be kept free in order to prevent the occurrence of overstress of the master or of faulty addressing. Thus, for minimizing the bus-shunt resistances and for establishing conformity with the LIN bus, it is reasonable to maximize the constant component in the addressing current. In the technical teaching disclosed in DE-B-10 2010 026 431, however, this value is varying around an addressing current value. Thereby, the available addressing current level is unnecessarily reduced.

From DE-B-10 256 631, EP-B-1 603 282, U.S. Pat. No. 7,590,140 EP-B-1 490 772 and EP-B-1 298 851, bus node addressing methods are known which require a shunt bus resistor (R2) within each auto-addressable bus node (SL1, SL2, SL3). This resistor has the disadvantage that it will degrade the EMC behavior toward a standard-conformal LIN bus node.

Object

Thus, it is an object of the disclosure to provide a solution which is free of the above disadvantages of the state of the art and which has further advantages.

Achievement of the Object

Auto addressing methods for—particularly serial—data bus systems make it necessary that, in the bus, there is connected a current measurement circuit (normally, but not necessarily, designed as shunt resistor) wherein, notably, this is provided for each addressable bus node to be addressed (see e.g. EP-B-1 490 772, EP-A-2 571 200 and EP-A-2 654 246). The current measurement circuit are required merely during the addressing phase. Thus, it would be of advantage if these current measurement circuit would not be effective anymore in the normal operation of the data bus system.

A "bus line" in the context of the disclosure is understood to denote both a one-wire bus and as a two-wire bus, wherein the latter can be differentially designed and operated. A "bus node" is understood to denote the connection hardware of a bus participant via which the bus participant is connected to the bus line. Thus, for instance, a bus node also comprises a bus transceiver but, above all, the normally existing pull-up resistor which can be considered to be a quiescent current source, and in some cases also the switches (optionally with control) by which a bus participant can connect the bus to ground. As far as a bus node is not a standard bus node but an addressable bus node that can be addressed, a bus node in the context of the disclosure also denotes the hardware for introducing an addressing current with appertaining current measurement unit and detection, as will still be described further below.

The disclosure according to this aspect relates to a method for control of a serial data bus system, wherein, in said method, in the addressing phase, an address is assigned to each addressable bus node in the opened state of the bypass switch, and in the operating phase, the current measurement circuit of each addressed addressable bus node is bypassed by closing the bypass switch.

Thus, according to the disclosure, there is provided, for each current measurement circuit, a bypass switch which, as is the case for the current measurement circuit, advantageously belongs to the addressable bus node and which will be controlled by the latter in dependence on whether the respective addressable bus node has already been provided with an address or not. In a still not addressed addressable bus node, the shunt switch is open. Already addressed addressable bus nodes will control the shunt switch in such a manner that the switch will now have been closed and, thus, the current measurement circuit will be shunted.

In a first variant of the disclosure, it can be provided that the addressing phase comprises a plurality of addressing cycles, wherein, per address cycle, an address is assigned to respectively one of the addressable bus nodes that have not or not yet been addressed, and that an addressable bus node that has been addressed in an addressing cycle will, from then on, not participate anymore in the further address assigning for other not-yet-addressed addressable bus participants, wherein the current measurement circuit which in the addressing phase has been assigned to an already addressed addressable bus node is bypassed by closing the bypass switch connected in parallel to the current measurement circuit.

According to the disclosure, it is thus possible to close the shunt switch as soon as an addressable bus node has received its address. Thus, if, in an addressing phase, a plurality of addressable bus nodes to be addressed shall be provided with addresses and, thus, a plurality of addressing cycles have to be performed in the addressing phase, one of the still open shunt switches can be closed after each addressing cycle. Alternatively, it is possible to shunt or to short-circuit each of the individual current measurement circuits only after termination of the addressing phase. Thus, during the addressing phase, all current measurement circuits are "active", which is of advantage since, during the addressing phase, there will then always exist the same "conditions" on the bus line, i.e. all of the current measurement circuits have been switched into the bus line.

In a further useful variant of the disclosure, it can be provided that, in the addressing phase, each addressable bus node that has not or not yet been addressed is operative to feed into the bus line an addressing current flowing to the bus master, said addressing current flowing through the current measurement circuit of the respective addressable bus node that has not or not yet been addressed.

According to the above described aspect of the disclosure, the disclosure also comprises an addressable bus node for a serial data bus system comprising a bus master connected to a bus line and comprising a plurality of bus nodes serially connected to the bus line, wherein some of the bus nodes are addressable bus nodes and others can be designed as standard bus nodes with already fixed addresses, each of said addressable bus nodes being adapted to have their addresses assigned by the bus master and comprising:

a current measurement circuit adapted to be switched into the bus line, a bypass switch connected in parallel to the current measurement circuit, an addressing current source for feeding into the bus line an addressing current flowing the bus master, and a control unit for controlling the bypass switch, wherein, in an addressing phase of the data bus system for assignment of an address, wherein the control unit is operative, in an addressing phase of the data bus system, to control the bypass switch to assign an address to assume the opened state, and, in an operative phase of the data bus system occurring after termination of the addressing phase, is operative to control the bypass switch to assume the closed state.

An alternative of the addressable bus node according to the disclosure can be seen in that the current measurement circuit is operative to detect inter alia the addressing current fed from the addressing current source into the bus line. Thus, such an addressable bus node is suited e.g. for an addressing method in wherein the addressing current which is fed into the bus line by each addressable bus node that has not yet been addressed, will immediately be detected as well. Thus, the current flowing on the bus line at the level of the addressable bus node includes, as one part, also the addressing current fed from the respective addressable bus node. Such an addressing method will still be explained in greater detail further below.

The disclosure further proposes a method for assigning addresses in a serial data bus system, wherein the data bus system comprises a bus master and bus nodes and wherein, on the one hand, the bus master is connected to the bus line and, on the other hand, the bus nodes are connected serially to the bus line. At least some of the bus nodes will feed into the bus line a respective current flowing to the bus master. One of the bus nodes is the first bus node connected to the bus line at a site closest to the bus master while the other bus nodes are connected to the bus line at sites upstream of the first bus node. Thus, in other words, one of the bus nodes is the last bus node connected to the bus line at a site farthest away from the bus master while the other bus nodes are connected to the bus line at sites downstream of this last bus node between this bus node and the bus master. At least two of the bus nodes are addressable bus nodes to which a respective address is assigned by the bus master in an addressing phase while other bus nodes can be standard bus nodes with their respective address already fixed prior to the performing of the addressing phase.

The motivation for an improved auto addressing in a serial data bus system such as e.g. in a LIN bus shall once again be briefly explained hereunder, namely on the example of a LIN bus.

The bus current during operation of a LIN bus has to be below a maximal value. If this value is exceeded, this indicates a short circuit of the bus toward ground, which must be detected.

During normal operation of a LIN bus, a so-called base current is flowing in it. This base current serves e.g. for the stability of the bus and makes the bus less vulnerable e.g. to electromagnetic interference.

In the auto addressing of the LIN bus nodes, the latter will feed an addressing current. Depending on how many bus nodes to be addressed are connected to the bus, a feed of the addressing currents by all bus nodes would cause the bus maximum current load to be exceeded. As a result, the auto addressing would not be possible.

For this reason, in the past, in LIN bus applications, there has been adopted the approach to insert a so-called preselect phase in which not all bus nodes are addressed but only a group of bus nodes, wherein the size of the group is selected in such a manner that, when the addressing currents of all bus nodes of this group are fed, the maximum current load of the bus is not exceeded.

A disadvantage of the LIN application resides in the shunt resistors in the bus. The intention is to keep these resistances as small as possible, e.g. in order to minimize losses or to avoid other network problems.

Once, however, the resistance values of these resistors are reduced, also the voltage drop, i.e. the measurement signal, will be reduced, and the latter has to be increased again. This entails the need for additional hardware.

In order to increase the measurement signal, notably without amplification, one has begun to adopt the approach to increase the addressing current. In this case, there exists an even higher risk of violating the maximum current limitation when performing the auto addressing.

According to the disclosure, the addressable participants comprise a bus node provided with a transceiver, i.e. with a hardware component connected to the bus line, which hardware component is additionally equipped with a unit for impressing an addressing current and for measuring addressing currents on the bus line. As viewed from the bus master, the current infeed is arranged in the bus line behind the shunt resistor which is located on the bus line as well.

It is assumed that the bus system comprises a mixed installation of addressable bus node and non-addressable standard bus nodes. The standard bus nodes have fixed addresses and do not participate in the auto addressing process. All bus nodes, i.e. both the standard bus nodes and the addressable bus nodes, will input quiescent bus currents into the bus line or can feed such bus currents, which is done for stabilization of the bus line and for uniform bus potential generation as viewed along the length of the bus line. Not every standard and/or addressable bus node necessarily has to feed this bus current during the auto addressing phase. Each addressable bus node will first detect the base current as the sum of all quiescent currents that are fed behind it by the standard and addressable bus nodes. There is now predefined a maximum bus current which is by a certain measure below that current value at which the bus master would detect a failure case (e.g. bus short circuit) and would pull the bus toward ground.

Now, all of the addressable bus nodes feed a respective addressing current which, however, is not fed abruptly. In the process, a bus node that is less remote as viewed from the bus master will measure "its" own addressing current and as well as further currents which can be fed by those bus nodes that are connected more remote from the bus master than the observed bus node of the bus line.

Thus, during the slow run-up of all not-yet-addressed addressable bus nodes, one of the addressable bus nodes arranged closer to the bus master will detect that the predefined maximum bus current is reached. Thereupon, this addressable bus node will run down its addressing power source, preferably faster than said node had run it up before. The other not-yet-addressed addressable bus nodes will continue to run up their addressing power sources until, then, a further addressable bus node arranged closer to the bus master will detect that the maximum bus current could be reached. Then, also this addressable bus node will run down its addressing power source.

This will lead to a "chain reaction" until, in the end, exclusively the last not-yet-addressed addressable bus nodes, i.e. the one arranged most remote from the bus master, has run up its addressing current source so far until the maximum bus current is measured by the bus master itself. Thereby, this addressable bus node "knows" that it has now been identified. This is because, after termination of an addressing cycle, this node is the only one whose addressing current source is supplying an addressing current. If, now, an address would be placed on the bus line, this addressable bus node would be able to accept the address as its own address. Alternatively, beforehand, an address can have been sent from the bus master to all not-yet-addressed addressable bus nodes so that, now, said addressable bus node will accept this address as its own address and the others of the not-yet-addressed addressable bus nodes will reject the bus address.

The above described method will function, in mixed installation, with particular advantage if the standard bus nodes are arranged exclusively behind the addressable bus node located most remote from the bus master. This is because, then, the addressable bus nodes can detect the sum of the quiescent currents fed by these standard bus nodes as a summated quiescent current. If the standard bus nodes are arranged between the bus master and the first addressable bus node, this addressable bus node and the further addressable bus nodes arranged therebehind do not know how large the base current composed of these quiescent currents is, because they cannot measure the quiescent currents of the standard bus nodes. This could be alleviated in that each addressable bus node will receive information on how many standard bus nodes are situated between the group of the addressable bus nodes and the bus master.

On the other hand, a mixed installation in the manner that standard bus nodes and addressable bus nodes alternately follow each other, could be tolerable. Notably, if, in this case, the last bus node, arranged most remote from the bus master should be an addressable bus node, only this one bus node would have to receive information on how many standard bus nodes are connected before it to the bus line.

The method of the disclosure serves for the assigning of addresses for the addressable bus nodes, wherein, in said method the bus nodes feed a quiescent current into the bus line or potentially feed a quiescent current into the bus line, or—alternatively—some of the standard bus nodes and/or some of the addressable bus nodes feed a quiescent current into the bus line and others of the standard bus nodes and/or of the addressable bus nodes feed no quiescent current into the bus line, each not-yet-addressed addressable bus node feeds an addressing current into the bus line, each not-yet-addressed addressable bus node detects, with the aid of a current measurement circuit, the bus current flowing through it as a sum of the quiescent currents of all bus nodes arranged upstream (i.e. quiescent currents both of the addressable bus nodes or of the respective not-yet-addressed addressable bus nodes and the standard bus nodes which optionally also feed a respective quiescent current into the bus line) and of its own addressing current and of the addressing currents of all not-yet-addressed addressable bus nodes arranged upstream, a maximum addressing current which is maximally allowable during the addressing phase is determined which together with the sum of all fed quiescent currents results in a maximally allowable maximum bus current which is smaller than that bus current flowing into the bus master at which, in the bus master, a failure case (e.g. bus short circuit) is detected (thus, in other words, the maximum addressing current is determined as the difference between that bus current flowing into the bus master at which a failure case (e.g. bus line short circuit) is detected and the sum of the quiescent currents of all bus nodes feeding a respective quiescent current into the bus line (which can be standard bus nodes and/or addressable bus nodes), in the addressing phase, a plurality of addressing cycles, each lasting for a predetermined length of time, are performed for identification of respectively one not-yet-addressed addressable bus node, wherein an addressable bus node identified in an addressing cycle does not participate anymore in the subsequent addressing process, e.g. by acting like a standard bus node, per addressing cycle,
  at the start, each not-yet-addressed addressable bus node feeds an addressing current into the bus line, said addressing current increasing with an increase rate,
  during the addressing phase, each not-yet-addressed addressable bus node measures the bus current flowing through it and compares the bus current to the maximum bus current and, if the maximum bus current is exceeded, reduces its addressing current fed into the bus line with a reduction rate, or each not-yet-addressed addressable bus node measures its addressing current fed into the bus line and compares the addressing current to the maximum addressing current and, if the maximum addressing current is exceeded, reduces its addressing current fed into the bus line with a reduction rate
  at the end of the addressing cycle, a sole not-yet-addressed addressable bus node remains which feeds the maximum addressing current into the bus line and thus is identified, and
an address is assigned to this identified addressable bus node.

According to the disclosure, each not-yet-addressed addressable bus node will detect its own addressing current fed into the bus line. Each addressable bus node knows the maximally allowable addressable maximum addressing current. The addressable bus nodes arranged closest to the bus master will, during the addressing phase and respectively during an addressing cycle, detect larger summated currents on the bus line than those addressable bus nodes which are connected to the bus line at sites farther away from the bus master and still are addressed. If, now, all not-yet-addressed addressable bus nodes feed a respective rising bus current into the bus line, one of the addressable bus nodes at the front, i.e. closer to the bus master, and particularly the first not-yet-addressed addressable bus node, will "notice" that it has to reduce the addressing current fed by it so that the maximum addressing current on the bus line will not be reached or even exceeded. The not-yet-addressed addressable bus node arranged closest to the bus master will finally control its addressing current toward zero, and this process will be continued across the next not-yet-addressed addressable bus node until, finally, only one not-yet-addressed addressable bus node will still feed its full addressing current into the bus line without the bus line conducting a bus current that is larger than the maximum addressing current. Thus, at the end of an addressing cycle, there exists only one not-yet-addressed addressable bus node that is in the above described operating state. To this addressable bus node which has now been identified, there can now be assigned an address.

A considerable advantage of the method of the disclosure resides in that, at the start of an addressing phase, it is already certain what an addressing current each not-yet-addressed addressable bus node is maximally allowed to feed. This addressing current is the same for all addressable bus nodes. The comparison of the current flowing on the bus line with the maximum addressing current is identical for each addressable bus node, which further simplifies the method of the disclosure.

According to a useful variant of the disclosure, it can be provided that a number of addressing cycles is performed that corresponds to the number of addressable bus nodes connected to the bus line.

A special case may exist when only one of the addressable bus nodes has not yet been addressed. Then, notably, one possibility consists in performing a further addressing cycle at whose end will become evident that exactly this not-yet-addressed addressable bus node has been identified and can be provided with an address. It is, however, also possible, when there is only one not-yet-addressed addressable bus node, to perform no further addressing cycle so that this not-yet-addressed addressable bus node will have its address assigned to it by the bus master, without this not-yet-addressed addressable bus node feeding an addressing current into the bus line.

According to a further useful variant of the disclosure, it can be provided that the assigning of the address to the addressable bus node identified in an addressing cycle is performed by assignment of an address to all not-yet-addressed addressable bus nodes prior to or at the start of the addressing cycle, or by assignment of the address at the end of an operating cycle.

As already described above, in each of the not-yet-addressed addressable bus nodes, the increasing of the addressing current takes place with a certain increase rate whereas the reduction of the addressing current takes place with a certain reduction rate. It generally holds true that it is suitable if the reduction rate with which, when the maximum bus current or the maximum addressing current is exceeded, each not-yet-addressed addressable bus node reduces its addressing current fed into the bus line, is selected to be higher than the increase rate with which each not-yet-addressed addressable bus node is feeding its addressing current into the bus line until the maximum addressing current is exceeded. Suitably, the increase rate and the reduction rate are defined by a first time constant (for the increase rate) and by a second time constant (for the reduction rate). The smaller the time constant is, the higher is the corresponding increase and respectively reduction rate. If, during an addressing cycle, a not-yet-addressed addressable bus node notices that, for observing the maximum addressing current on the bus line, it has to reduce its addressing current, this should be performed considerably faster than the further increase of the addressing currents which are fed into the bus line by the other not-yet-addressed addressable bus nodes. Namely, when one of the not-yet-addressed addressable bus nodes reduces its addressing current, it may happen that the other not-yet-addressed addressable bus nodes will not notice this because, due to the fact that they measure other summated currents on the bus line, they detect a bus current which is still more or less distinctly smaller than the maximum addressing current. Thus, these not-yet-addressed addressable bus nodes will continue to feed their addressing current until the first of these other not-yet-addressed addressable bus nodes will notice that the maximum addressing current load is reached so that, as a consequence of this, this node, too, will reduce its addressing current. This entire process makes it suitable to perform the reduction of the addressing current with a considerably larger reduction rate than the increasing of the addressing currents. The second time constant, i.e. the reduction rate, should suitably be smaller than the first time constant, i.e. the increase rate, at least by the factor 2 or 5 or 10 or 20 or 50 or 100 or 200 or 500 or 1000.

Alternatively or additionally to the above, the first and/or the second time constant for a not-yet-addressed addressable bus node can respectively depend on, or be made dependent on, the amount of a bus current detected by the not-yet-addressed addressable bus node or the amount of an addressing current fed into the addressable bus node by the not-yet-addressed addressable bus node.

According to a further useful variant of the disclosure, it can be of advantage if the first and/or the second time constant are different respectively in dependence on whether the bus current detected by a not-yet-addressed addressable bus node or the addressing current fed into the bus line by a not-yet-addressed addressable bus node is larger than or equal to a threshold value or smaller than the threshold value or—alternatively—is larger than a threshold value or smaller than or equal to the threshold value.

In the above described alternative in regard to the selection of the two time constants, it can be further provided that, for the bus current detected by the not-yet-addressed addressable bus node or the addressing current fed into the bus line by the not-yet-addressed addressable bus node that is at or above the threshold value, the first time constant becomes larger or is larger than for the bus current detected by the not-yet-addressed addressable bus node or the addressing current fed into the bus line by the not-yet-addressed addressable bus node that is at or below the threshold value, and/or that, for the bus current detected by the not-yet-addressed addressable bus node or the addressing current fed into the bus line by the not-yet-addressed addressable bus node that is from or below the threshold value, the second time constant becomes smaller or is smaller than for the bus current detected by the not-yet-addressed addressable bus node or the addressing current fed into the bus line by the not-yet-addressed addressable bus node that is at or above the threshold value.

As a result of the above described variants in regard to the selection of the time constants and the selection of the amounts of the reduction and increase rates relative to each other, it thus becomes evident that, the greater the factor by which the second time constant or its largest value is smaller than the first time constant or its largest value, the larger the maximum addressing current that can be selected, the maximum addressing current being smaller than the maximum bus current.

According to a further useful variant of the disclosure, it can be provided, for examining whether the address assignment has been correctly performed, that, at the end of the last addressing cycle, it is examined, through inquiry by the bus master, whether there exists at least one not-yet-addressed addressable bus node.

Further, for the above mentioned purpose, it can be advantageously provided that, at the end of each addressing cycle or at the end of at least some addressing cycles and with knowledge of the number of the to-be-addressed addressable bus nodes and particularly at the end of the last addressing cycle, each still not addressed addressable bus node will send to the bus master a corresponding message on the still not yet performed address assignment.

According to a further variant of the disclosure, in the addressing phase, there can be performed so many addressing cycles until it is detected, particularly by the bus master, that none of the addressable bus nodes feeds an addressing current or at least not the maximum addressing current into the bus line.

For reduction of possible errors in the address assignment, it is further of advantage if it is examined at the end of an addressing cycle whether there exists a previously not-yet-addressed addressable bus node to which an address is to be assigned, and/or it is examined at the end of an addressing cycle whether the addressable bus node identified for the assignment of an address has accepted the assigned address.

If, alternatively, the number of the bus nodes to be addressed is known prior to the start of the addressing phase and there is thus known the number of the addressing cycles to be performed, it can be examined after termination of the addressing phase whether an address has been assigned to each addressable bus node.

According to a further useful variant of the disclosure, it can be provided that the identification of the respective not-yet-addressed addressable bus node is performed as soon as, within the addressing cycle and thus potentially before the end of the predetermined length of time of the addressing cycle, it is detected that one of the not-yet-addressed addressable bus nodes is feeding the maximum addressing current into the bus line. This has the advantage that e.g. electromagnetic interference that still occur afterwards during an addressing cycle cannot anymore have an effect on the already concluded process of identifying a not-yet-addressed addressable bus node.

It can be of advantage for the performing of the method of the disclosure if all standard bus nodes which already prior to the performing of the addressing phase have a fixed address are connected to the bus line at sites downstream of all addressable bus nodes.

Alternately, it is possible that at least one standard bus node which already prior to the addressing phase has a fixed address is connected to the bus line at a site downstream of an addressable bus node, and that this addressable bus node will receive information on the number of standard bus nodes arranged downstream relative to this addressable bus node and will thus know a possible maximum of the sum of the quiescent currents fed into the bus line by this standard bus node.

With the disclosure, there is further proposed an addressable bus node for a serial data bus system comprising a bus master connected to a bus line and comprising a plurality of bus nodes serially connected to the bus line, wherein some of the bus nodes are addressable bus nodes and others can be designed as standard bus nodes with already fixed address, said addressable bus node being adapted to have its address assigned by the bus master and comprising:

a current measurement circuit, an addressing current source for feeding an addressing current into the bus line and via the bus line to the bus master, namely upon detection by the current measurement circuit, and a quiescent current source for feeding a quiescent current into the bus line and via the bus line to the bus master, wherein the quiescent current source can be identical with the addressing current source, and a control unit for increasing, with an optionally variable increase rate, the addressing current supplied from the addressing current source up to the potential exceeding of a predefinable maximum current, and for reducing, with an optionally variable reduction rate, and particularly down to zero, the addressing current supplied from the addressing current source, in case of a potential one-time exceeding of the maximum value.

According to a useful variant of the disclosure, it can be provided that the current measurement circuit will detect the addressing current of the addressing current source to be fed into the bus line and that the control unit compares the addressing current with a predefinable maximum addressing current.

According to a further useful variant of the disclosure, it can be provided that the current measurement circuit is adapted to be integrated into the bus line and will detect the bus current, and that the control unit compares the bus current with a predefinable maximum addressing current.

According to the disclosure, it can be provided that the increase rate is defined by a first time constant and the reduction rate is defined by a second time constant, and that the second time constant is smaller than the first time constant at least by the factor 2 or 5 or 10 or 20 or 50 or 100 or 200 or 500 or 1000.

According to a useful variant of the disclosure, it can be provided that the first and/or the second time constant are respectively selected in dependence on the amount of the bus current detected by a not-yet-addressed addressable bus node or in dependence on the amount of the addressing current fed into the addressable bus node by a not-yet-addressed addressable bus node.

According to a further useful variant of the disclosure, it can be provided that the first and/or the second time constant are respectively different in dependence on whether the bus current detected by a not-yet-addressed addressable bus node or the addressing current fed into the bus line by a not-yet-addressed addressable bus node is larger than or equal to the threshold value or, alternatively, is larger than a threshold value or is smaller than or equal to the threshold value.

In auto addressing methods for automatic assignment of addresses to addressable bus nodes of a serial data bus system, it can be of advantage if each addressable bus node to which an address is assigned is capable of detecting, by measurement technology, the amount of the current flowing at its connection point with the bus line, wherein this connection point bus current includes also the own addressing current fed by the respective addressable bus node. A precondition for this, however, resides in that, in the design of the serial data bus system, each bus node is connected to the bus line correctly, i.e. in the right "orientation".

Accordingly, a further aspect of the disclosure relates to a method for feeding addressing currents into the bus line of a serial data bus system, namely via addressable bus nodes, wherein the data bus system comprises, apart from a bus master and the addressable bus nodes and optionally standard bus nodes, a bus line which, on the one hand, has the bus master connected to it and which, on the other hand, has the bus nodes serially connected to it. In this regard, it applies in the framework of the disclosure that the bus line can comprise a one-wire bus or a two-wire bus which is optionally operated in a differential manner, i.e. with differential signals.

One aspect of the disclosure relates to a method for detection of the correct feeding of addressing currents via bus nodes of a serial data bus system into the bus line thereof, wherein, in said method the bus nodes feed a quiescent current into the bus line or potentially feed a quiescent current into the bus line, or—alternatively—some of the standard bus nodes and/or some of the addressable bus nodes feed a quiescent current into the bus line and others of the standard bus nodes and/or of the addressable bus nodes feed no quiescent current into the bus line, each not-yet-addressed addressable bus node feeds an addressing current into the bus line, each not-yet-addressed addressable bus node detects, with the aid of a current measurement circuit, the bus current flowing through it as a sum of the quiescent currents of all bus nodes arranged upstream (i.e. quiescent currents both of the addressable bus nodes or of the respective not-yet-addressed addressable bus nodes and the standard bus nodes which optionally also feed a respective quiescent current into the bus line) and of its own addressing current and of the addressing currents of all not-yet-addressed addressable bus nodes arranged upstream, a maximum addressing current which is maximally allowable during the addressing phase is determined which together with the sum of all fed quiescent currents results in a maximally allowable maximum bus current which is smaller than that bus current flowing into the bus master at which, in the bus master, a failure case (e.g. bus short circuit) is detected (thus, in other words, the maximum addressing current is determined as the difference between that bus current flowing into the bus master at which a failure case (e.g. bus line short circuit) is detected and the sum of the quiescent currents of all bus nodes feeding a respective quiescent current into the bus line (which can be standard bus nodes and/or addressable bus nodes), during an addressing phase, individual ones of these bus nodes are identified by analysis of addressing currents fed by not-yet-addressed addressable bus nodes, a not-yet-addressed addressable bus node feeds the addressing current into the bus line selectively at one of two nodes, wherein the current measurement circuit is arranged between the two nodes, and for a or in a not-yet-addressed addressable bus node, there is selected that node for feeding the addressing current at which the current measurement circuit detects the addressing current or at which the current measurement circuit detects a test current which, for detecting that node at which the current measurement circuit detects the test current, is selectively fed into one of the nodes or serially into each of the nodes.

Thus, according to this aspect of the disclosure, the method will ensure that, independently of a mix-up between the inputs and outputs of an addressable bus node via which the bus node is integrated into the serial data bus, the feeding of the addressing current is always performed in such a manner that this fed addressing current which is flowing in the direction of the bus master, will in each case flow also through the current measurement circuit connected into the bus line, and respectively will be detected by the current measurement circuit.

According to a first variant of the disclosure, each addressable bus node or at least some of the addressable bus nodes comprises/comprise two addressing current, including a first addressing current source and a second addressing current source. In this case, the first addressing current source is in operative connection with the bus line via a first node on a first side of the current measurement circuit and the second addressing current source is in operative connection with the bus line via a second node on a second side of the current measurement circuit. Between the first and second nodes, now, there is arranged the current measurement circuit, or the current measurement circuit itself is in operative connection with the bus line, namely with that section of the bus line which is arranged between the said first and second nodes.

Under the aspect of hardware expenditure, it is advantageous, if, as provided according to a further variant of this aspect of the disclosure, each addressable bus node or at least some of the addressable bus nodes comprises/comprise a sole addressing current source. In this variant of the disclosure, it then applies that the addressing current flows into the input of a switching unit which comprises two outputs, one of them being in operative connection with one node and the other being in operative connection with the other node, the switching unit is transferred into a first switching position in which the input of the switching unit is connected one of the outputs thereof, or is preset to this first switching position, when the addressing current or the test current is fed, it is examined in this first switching position of the switching unit whether the current measurement circuit detects the addressing current or—alternatively the test current, this first switching position is maintained if the current measurement circuit detects the addressing current or—alternatively—the test current, and if this is not the case, the switching unit is transferred into a second switching position in which the input of the switching unit is connected to the other output thereof.

In this aspect of the inventive detection of the correct feeding of addressing currents via bus nodes of a serial data bus system, there is further proposed, according to the disclosure, an addressable bus node for a serial data bus system comprising a bus master connected to a bus line and comprising a plurality of bus nodes serially connected to the bus line, wherein some of the bus nodes are addressable bus nodes and others can be designed as standard bus nodes with already fixed address, said addressable bus node being adapted to have its address assigned by the bus master and comprising:

a current measurement circuit, an addressing current source for feeding an addressing current into the bus line and via the bus line to the bus master, namely upon detection by the current measurement circuit, and a quiescent current source for feeding a quiescent current into the bus line and via the bus line to the bus master, wherein the quiescent current source can be identical with the addressing current source, and a control unit for controlling at least the addressing current source for feeding the addressing current via selectively one of two nodes into the bus line, wherein the current measurement circuit is arranged between the two nodes, wherein the control unit comprises an evaluating unit for detecting that one of the two nodes at which, when the addressing current or a test current current is fed, the current measurement circuit detects this current, and wherein the addressing current is to be fed into the bus line via that node at which the current measurement circuit has detected the addressing current or—alternatively—has previously detected the test current.

According to a first variant of the addressable bus node of the disclosure, the addressable bus node comprises a switching unit having an input being in operative connection with the addressing current source and having two outputs, one of them being connected to the first node and the other to the other node, wherein the input of the switching unit can be selectively brought into operative connection with one output thereof or with the other output thereof, and wherein the switching unit upon request by the control unit can be transferred into that switching position in which the current measurement circuit detects an addressing current or test current flowing through the switching unit.

According to a further variant of the addressable bus node of the disclosure, the addressable bus node comprises a first and a second addressing current source, one of them being connected to one node and the other to the other node, and a monitoring unit for detecting in which one of the two nodes, when the addressing current or a test current is fed, the current measurement circuit detects this current, wherein the addressing current is to be fed into the bus line by that addressing current source which is connected to that node at which, when the addressing current or—alternatively—the test current has been fed, the current measurement circuit has previously detected the current.

First, for better orientation, there will be defined hereunder the following directions on the data bus: The viewing direction from a bus node is to be understood in the sense that everything which exists in the data bus between the bus node and the bus master is arranged BEFORE the viewed bus node and thus, in relation to the direction of the current flowing to the bus master, is downstream of the viewed bus node, and that everything which exists between the viewed bus node and the end of the data bus is arranged BEHIND the bus node and thus, in relation to the direction of the current, is upstream of the viewed bus node. These definitions hold true throughout the application.

Hereunder, there will first be described an exemplary method for the automatic address assignment with reference to a standard-conforming LIN bus system. Only at the end of this section, the disclosure will be described.

In the disclosure, in contrast to the methods and the devices of der DE-B-10 147 512, EP-B-1 490 772 and U.S. Pat. No. 9,331,866, the resistance value of the bus-shunt resistor can be lowered to such an extent that standard conformity can be reached again. The Local Interconnect Network (LIN), also referred to as LIN bus, is a serial communication system for the networking of sensors and actors, i.e. a field bus. LIN will be put to use when the bandwidth and the versatility of a Controller Area Network (CAN) are not needed. Typical exemplary applications are the networking within the door or the seat of an automobile. The relevant standard is the ISO-Norm 17987-1, "Road vehicles—Local interconnect network (LIN)—Part 1-7".

The basic idea of the disclosure described here in an exemplary manner now resides in utilizing the addressing current source for the self test and thus to fulfill the requirements of ISO 26262. For this purpose, deviating from the teaching of DE-B-10 2010 026 431, there is not measured the bus current flowing from the subsequent addressable bus node through the respective bus node but, instead, the summated current (i1, i2, i3) leaving the respective addressable bus node, which is composed of the addressing current which in this respective addressable bus node is fed into the data line by the addressing current source (Iq1, Iq2, Iq3) of this respective addressable bus node, and of the bus current flowing from the subsequent addressable bus node—i.e. the one located upstream—through the respective addressable bus node. Under the architectural aspect, this means that the bus shunt resistor (R2) of the respective bus node (SL1, SL2, SL3) is each time arranged before the respective addressing current source Iq2, Iq3) so that the own addressing current of the respective bus node has to flow through this bus shunt resistor (R2) in order to reach the bus master (ECU) where it will be drained toward ground.

Beyond the above, a further aspect of the disclosure presented here resides in that, in contrast to all of the above-mentioned documents, during the address assignment process, a substantially constant output current ($i_j$) of the respective bus node ($SL_j$) is fed from the output of each addressable bus node into the preceding bus node in the direction of the bus master (ECU).

A possible problem consists in existing bus nodes (CS1, CS2) which have no capability for auto addressing in the sense of the disclosure, i.e. comprise previously fixed addresses. In the framework of the disclosure, it is generally assumed that there exists no mixed installation with addressable bus nodes having auto addressing capabilities corresponding to other auto addressing methods. The standard bus nodes (CS1, CS2) without auto addressing capability will feed, by their bus current source (S1, R3, d1), a respective bus current, the bus node base current, into the data bus in the direction of the bus master (ECU). Preferably, these will be bus nodes (CS1, CS2) which exist only once in the data bus and thus, by way of their appearance, can be visually differentiated in an easy manner by the installer, e.g. during assembly of an automobile. As a result, an auto addressing during installation of these bus nodes, e.g. in an automobile during the assembly of the latter, will not be necessary. Each of these standard bus nodes (CS1, CS2) will feed, in correspondence to the LIN standard, a base (quiescent) current portion into the data bus by means of a pull-up current source (S1, R3, d1). Thus, these standard bus nodes (CS1, CS2) together will bring about a maximum base current. This base current can be estimated by the addressable bus nodes with auto addressing capability, hereunder referred to as auto-addressable bus nodes, which is possible due to the indication of the number of standard bus nodes without auto addressing capability.

There exist two extreme configurations by way of which the resultant problem can be demonstrated. In both extreme configurations, the number of standard bus nodes is at the maximum while the number of auto-addressable bus nodes with auto addressing capability is at the minimum.

Configuration A

In configuration A, all of the number n of standard bus nodes which have no auto addressing capability are arranged, as viewed from the bus master (ECU), behind e.g. merely two auto-addressable bus nodes which have the auto addressing capability according to the presently described disclosure. The maximum number n of the standard bus nodes behind the two auto-addressable bus nodes with auto addressing capability is then $n+2)<I_{max}/I_k$. Herein, $I_{max}$ is the maximum current value which the bus master (ECU) can take up in the auto addressing phase in accordance with the ISO standard. Preferably, the maximum current value $I_{max}$ is selected to be a bit smaller than the real maximum current value of the bus master (ECU) so as to accommodate manufacturing tolerances and operating parameter variations. $I_k$ is the upper limiting value for the amount of the bus node base current that is fed into the data bus by the totality of the standard bus nodes without auto addressing capability. Preferably, each of the standard bus nodes without auto addressing will feed substantially the same bus node base (quiescent) current into the data bus. The standard bus nodes will then generate, at the input of the second auto-addressable bus node with auto addressing capability, a maximum base current of $I_G=n*I_k$. For the auto addressing by the auto-addressable bus nodes with auto addressing capability, there remains a current range of $I_{amax}=2*I_k$ for the maximum addressing current of each auto addressable bus node. This current range for the maximum addressing current of each auto addressable bus node can then be utilized for auto addressing. For this purpose, in an advance phase A, the auto addressable bus nodes can measure this base current by their respective bus shunt resistor (R2) and then detect the current range for the maximum addressing current of each auto addressable bus node and then use it for auto addressing. Thereby, the voltage drop across the bus shunt resistors (R2) will become maximal. Thus, these can be minimized. This is in contrast to DE-B-10 2010 026 431 which does not solve this problem.

Configuration B

In configuration B, all of the number n of standard bus nodes which have no auto addressing capability are arranged, as viewed from the bus master (ECU), before the merely two auto-addressable bus nodes which have the auto addressing capability according to the presently described disclosure. In contrast to configuration A, the auto addressable bus nodes now cannot receive information on the number of standard bus nodes in the direction of the bus master (ECU) before them, i.e. downstream of them. Thus, the danger exists that the maximum addressing current used by the addressable bus nodes, in combination with the base current—arriving at the bus master—of all preceding bus nodes in the data bus is too large, which would cause an error message. The maximum number n of the standard bus nodes behind the two addressable bus nodes with auto addressing capability is, however, again $(n+2)<I_{max}/I_k$. Herein, $I_{max}$ is again the maximum current value which the bus master (ECU) can take up in the auto addressing phase. Preferably, also here, the maximum current value $I_{max}$ is selected to be a bit smaller than the real maximum current value of the bus master (ECU) so as to accommodate manufacturing tolerances and operating parameter variations. $I_k$ is the upper limiting value for the amount of the bus node base current which is fed into the data bus by the totality of the bus nodes. Preferably, also here, each of the standard bus nodes will feed substantially the same bus node base current into the data bus. The standard bus nodes will then generate, at the input of the bus master (ECU) a maximum base current of $I_G=n*I_k$. For the auto addressing by this subsequent auto addressable bus node with auto addressing capability, there again remains a current range of $2*I_k$ for the addressing current ($I_a$). Via this current range, however, the subsequent auto addressable bus nodes with auto addressing capability cannot receive information. Even though this current range can be used for auto addressing, it now has to be communicated to the auto addressable bus nodes with auto addressing capability by the bus master (ECU). This can be performed in that the bus master will communicate, to all bus nodes, the number of standard bus nodes by means of a message directed to all bus nodes, or will in advance communicate a suitable addressing current value by way of such an instruction. This makes it possible to maximize the addressing current in the respective auto addressable bus nodes.

Configuration C

Configuration C is a mix of configuration A and configuration B.

In this configuration, in the serial data bus, standard bus nodes are arranged before, i.e. downstream, and behind, i.e. upstream of the addressable bus nodes with auto addressing capability. In this case, the bus master (ECU) only has to transmit the number n of the standard bus nodes situated before the auto addressable bus nodes. The auto addressable bus nodes, by measuring the base current through their bus shunt resistor relative to the subsequent bus node, can thus detect the total base current by summation of this base current with n times the bus node base current $I_k$. Alternatively, the bus master (ECU) can also transmit a different value from which the bus base current can be computed. On this basis, again, each auto addressable bus node can compute the maximum addressing current $I_{amax}$ and adjust it to the maximum.

Thus, before the bus node addresses are assigned, the bus master (ECU) will preferably signal to all bus nodes which configuration of the above indicated configurations is present and how many standard bus nodes exist in the system that have no auto addressing capability, and/or how large the expected threshold value is.

At the start of the auto addressing, the bus master (ECU) will pull the data line toward ground by means of a switch (SB) or the like. The current sink used for this purpose can take up the maximum current value $I_{max}$. If this value is exceeded by the amount of the bus current into the bus master (ECU), the bus master (ECU) may suffer a short circuit and generate corresponding signals and error messages. Thus, in normal operation, the amount of this maximum current value $I_{max}$ is not allowed to be exceeded.

In dependence on the number of standard bus nodes and the maximum allowable bus current $I_{max}$ as predefined by standard, each bus node can then compute the maximum addressing current $I_{amax}$ of its respective addressing current source (Iq1, Iq2, Iq3) that is still allowable without exceeding the maximum allowable bus current ($I_{max}$). Preferably, the bus node with auto addressing capability receives the number n of the standard bus nodes without auto addressing capability and computes, based on the number n, the maximum addressing current $I_{amax}$ of its respective addressing current source (Iq1, Iq2, Iq3). In this regard, there is preferably also considered a safety margin so that the real set auto addressing current $I_{amax}$ of the addressing current sources of the auto addressable bus nodes (SL1, SL2, SL3) is smaller than the real maximum allowable auto addressing current.

It has to be safeguarded now that the maximum allowable bus current $I_{max}$ will not be exceeded. In contrast to DE-B-10 2010 026 431, it is now not provided that the base current and addressing current coming into the auto-addressable bus node from the subsequent bus nodes will be detected and, when deviating from the base current, will deactivate its own addressing current source.

Instead, there is detected the summated current (i1, i2, i3) which leaves the respective auto addressable bus node via the data bus in the direction of the bus master (ECU). This current is composed of the bus current fed from the subsequent auto-addressable bus node and optionally standard bus nodes plus the self-fed addressing current.

For this purpose, the respective auto-addressable bus node (SL1, SL2, SL3) will measure to outgoing bus current (i1, i2, i3) which, coming from the subsequent auto-addressable bus node (SL2, SL3), flows through the respective auto-addressable bus node (SL1, SL2, SL3) and, at the output of the respective bus node, leaves the same again in the direction of the bus master (ECU). The respective auto-addressable bus node (SL1, SL2, SL3) will now control its own addressing current source (Iq1, Iq2, Iq3) in such a manner that the sum of the incoming bus current of the subsequent bus nodes (SL2, SL3) and the addressing current of the own addressing current source Iq2, Iq3) corresponds to a predetermined summated current ($I_s$). The amplitude of the addressing current ($I_a$) is set in such a manner that the maximum bus current $I_{max}$ cannot be exceeded by the amount of the outgoing bus current (i1, i2, i3). Thus, the bus (i1, i2, i3) leaving the respective bus node (SL1, SL2, SL3) will remain constant and will not be increased beyond its maximum value by the respective bus node (SL1, SL2, SL3). Overstress on the bus master current sink during the address assigning process is thus excluded.

Thus, in this method, each of the auto-addressable bus nodes participating in the address assigning method will detect an additional current deviating from the base current. This additional current is composed of the own addressing current of the respective bus node and the addressing current of the bus node following the respective auto-addressable bus node (SL1, SL2, SL3) (addressable bus node and optionally standard bus node).

In order to avoid the occurrence of an overmodulation of the output current (i1, i2, i3) beyond $I_{max}$, the respective bus node will control its output current (i1, i2, i3) in the direction of the bus master (ECU) in such a manner that it will always correspond to the predefined maximum value of the addressing current $I_{amax}$ plus the base current. For this purpose, the addressing current source (Iq1, Iq2, Iq3) within each auto-addressable bus node (SL1, SL2, SL3) with auto addressing capability is designed to be controllable. The addressing current of the respective addressing current source (Iq1, Iq2, Iq3) will then depend, on the one hand, on the previously detected maximum value ($I_{amax}$) and, on the other hand, on a control signal which is detected by means of a control path (F) and a measurement circuit (R2, D1) from the output current (i1, i2, i3) of the respective bus node (SL2) in the direction of the bus master (ECU).

The control path thus begins at a measurement circuit, preferably a bus shunt resistor (R2) which, as viewed from the bus master (ECU), is arranged before the respective bus node (SL1, SL2, SL3) in the data bus. There, the bus current will be transformed, from the respective bus node in the direction of the bus master (ECU), into a voltage value. The latter will be detected by a measurement circuit, e.g. an operational amplifier (D1) and, optionally after filtering (F), converted to a control value by which the respective addressing current source (Iq1, Iq2, Iq3) can then be controlled in such a manner that, in this address assigning phase, the bus current (i1, i2, i3) in the direction of the bus master (ECU) will be kept constant.

In this situation, provided that the required control loop is designed in a suitable manner, a control value—the control amount—will occur within the respective bus node (SL1, SL2, SL3), preferably as an output signal of said filter (F). For the sake of simplification, there shall be assumed here, by way of example, that this control value is directly proportional to the respective output current (i1, i2, i3) of the respective auto-addressable bus node (SL1, SL2, SL3) in the direction of the bus master (ECU).

In case that, after lapse of said predefined initialization time, this control value still exceeds a predetermined threshold value (SW), i.e. if the own addressing current source (Iq1, Iq2, Iq3) feeds the predetermined output current in the direction of the bus master (ECU), the respective auto-addressable bus node is, as viewed from the bus master (ECU), the last one in the chain of the auto-addressable bus nodes. The respective auto-addressable bus node will then take over the to-be-assigned bus node address—being previously or subsequently transmitted by the bus master (ECU) to all auto-addressable bus nodes (SL1, SL2, SL3)—as its own now valid bus node address and does not participate anymore in further initialization runs, except in case that, due to a reset order or other reset condition, the received bus node address is declared to be invalid. The other auto-addressable bus nodes which do not yet have a valid bus node address will participate in subsequent initialization runs.

Preferably, the control of the output current values of the addressing current sources (Iq1, Iq2, Iq3) is performed within the auto-addressable bus nodes (SL1, SL2, SL3) with filtering by a filter (F). Preferably, the control loop forms a PI controller. This filtering is necessary so that there will occur no overshoot effects during the generating of the addressing current by the totality of the auto-addressable bus nodes (SL1, SL2, SL3) at the bus master (ECU). If this were to happen, the maximum allowable $I_{max}$ could be exceeded and the bus master (ECU) could detect a short circuit, which is to be avoided.

Thus, it is advantageous and preferred to include at least one low pass filter (F) into the control circuit of each auto-addressable bus node (SL1, SL2, SL3).

According to a further preferred variant of the disclosure, the filter (F) is designed as a non-linear filter. Preferably, in this case, a first control time constant ($\tau_1$) of the non-linear filter (F) for increasing the addressing current of the respective addressing current source (Iq1, Iq2, Iq3) of the respective bus node (SL1, SL2, SL3) should be larger than a second control time constant ($\tau_2$) of the non-linear filter (F) for lowering the addressing current of the respective addressing current source (Iq1, Iq2, Iq3) of the respective bus node (SL1, SL2, SL3). It has become evident that, in a number m of auto-addressable bus nodes, the second time constant ($\tau_2$) defining the reduction of the addressing current of the respective addressing current source (Iq1, Iq2, Iq3) should be shorter by a factor m than the first time constant ($\tau_1$) defining the increase of the addressing current of the respective addressing current source (Iq1, Iq2, Iq3). This has the effect that the addressing current of the respective addressing current source (Iq1, Iq2, Iq3) of the respective bus node (SL1, SL2, SL3) is lowered faster than it is increased. Thus, subsequent auto-addressable bus node will control their addressing current downward faster than it is controlled upward by other auto-addressable bus nodes. Thus, there is safeguarded a constancy of the bus current, at least, however a permanent falling-short of a maximum bus current value $I_{max}$, during the addressing phase. Simulations have shown that the first time constant ($\tau_1$) by which the addressing current source (Iq1, Iq2, Iq3) of the respective bus node (SL1, SL2, SL3) is controlled upward, should preferably be larger by a factor 10, better by a factor 100, than the second time constant ($\tau_2$) by which the addressing current source (Iq1, Iq2, Iq3) of the respective bus node (SL1, SL2, SL3) is controlled downward.

In a typical LIN bus, however—as already described—there exist, as a matter of experience, also standard bus nodes without auto addressing capability. During the addressing phase, these will supply a constant permanent current into the bus master (ECU). Now, in contrast to other methods, which are base-current-related, the threshold for the detection of the last bus position for the auto-addressable bus node which in the respective initialization run has to be provided with a bus node address, can be set very high.

After an auto-addressable bus node with auto addressing capability has received a valid bus node address in this manner, it will preferably use its addressing current source like a bus node base current source and will then behave like a bus node without auto addressing capability. In the Figures, there are nonetheless included, as a possible alternative, separate bus node base current sources (S1, R3, d1) in the auto-addressable bus node (SL1, SL2, SL3). These could then be omitted. Preferably, this state of an auto-addressable bus node after performed assignment of a valid bus node address will be changed only by resetting the auto-addressable bus node or by cancelling the validity of the bus node address. Thus, in the next initialization run, the last auto-addressable bus node as viewed from the bus master (ECU) will receive a valid bus node address and will then behave like a standard bus node, i.e. will not participate anymore in the further auto addressing method. The auto-addressable bus nodes which have not yet received a valid bus node address will continue to behave like auto-addressable bus nodes. With this, an initialization run has come to end. The bus master will then initiate a further initialization run in which, the auto-addressable bus node behind the last auto-addressable bus node as viewed from the bus master (ECU) in the previous initialization run will then be the last auto-addressable bus node as viewed from the bus master, will receive a valid bus node address, and so forth. This repeated triggering of the initialization runs by the bus master (ECU) and the assigning, in such an initialization run, of a valid bus node address to the—as viewed from the bus master—last auto-addressable bus node that will behave as that, will be performed until all auto-addressable bus nodes have received a valid bus node address from the bus master (ECU). In order to verify this, it is preferred that the bus master (ECU) will examine after each initialization run whether the addressed auto-addressable bus node which is supposed to have just received a valid bus node address, is giving a response. Preferably, the addressed auto-addressable bus node will then transmit a random number to the bus master (ECU) upon request by the bus master (ECU). In case that—for whatever reasons—two auto-addressable bus nodes are active, bus collisions will occur. These can be detected by the bus node and be signaled to the bus master (ECU). In certain cases, when a response can be predetermined, also the bus master (ECU) can directly detect a bus collision. Thereby, the bus master (ECU) can recognize a bus collision either directly or indirectly and optionally repeat the initialization of the respective bus node address. For this purpose, it is useful if the bus master (ECU) can send a cancellation order for the last assigned bus node address to all bus nodes.

During the address assigning, the bus current through the bus shunt resistor (R2) can now be examined for several conditions:

a) If the voltage drop across the bus shunt resistor (R2) is above a maximum voltage drop threshold value, there will occur, in the subsequent data bus section, a short circuit after the supply voltage. In this case, the respective bus node will preferably switch off all current sources so as to exclude damage to the system. Normally, however, also the bus master (ECU) will then detect this short circuit.

b) If the voltage drop across the bus shunt resistor is 0 V, the measurement input is typically short-circuited.
c) If the voltage drop across the bus shunt resistor (R2) is below a maximum voltage drop threshold value but above a second voltage drop threshold value, it is assumed that the bus shunt resistor is separated from the subsequent bus nodes and the measurement input is still connected to the subsequent bus nodes which will pull up the potential of this measurement line toward the supply voltage.
d) If the voltage drop across the bus shunt resistor (R2) is in the range of the voltage drop of the base current, the own addressing current source (Iq1, Iq2, Iq3) of the respective bus node will not be working, even though it is the last one. The bus node can signal this to the bus master (ECU) e.g. by provoking a bus collision by taking over the to-be-assigned bus node address as a valid bus node address. This will then have the effect that, in the examination for a correct bus node addressing, two bus node addresses will respond to the bus master, which the bus master can then detect. There is thus provided a method for the assigning of bus node addresses within a serial data bus comprising a chain of bus nodes (SL1, SL2, SL3) and bus master (ECU), wherein the bus nodes (SL1, SL2, SL3) can be auto-addressable bus nodes or standard bus nodes and the data bus comprises a bus master (ECU). Each bus node (SL2, SL3) has a preceding bus node (SL1, SL2) unless it is the first bus node (SL1). Each bus node (SL2, SL3) is connected to its preceding bus node (SL1, SL2) by the data bus unless it is the first bus node (SL1). The first bus node (SL1) is connected to the bus master (ECU) by the data bus. Each bus node (SL2, SL3) will send a bus node output current (i2, i3) to its preceding bus node (SL1, SL2) via a bus node output unless it is the first bus node (SL1). The first bus node (SL1) sends a bus node output current (i1) to the bus master (ECU) via a bus node output. Each bus node (SL1, SL2) receives a bus node input current (i2, i3) from its subsequent bus node (SL2, SL3) via bus node input unless it is the last bus node (SL3). The method comprises the steps:

determining the maximum addressing current ($I_{amax}$);
performing an initialization sequence comprising the following steps for each auto-addressable bus node of the bus nodes (SL1, SL2, SL3) that does not yet have a valid bus node address, until all auto-addressable bus nodes of the bus nodes (SL1, SL2, SL3) have valid bus node address:
  signaling a to-be-assigned bus node address to all auto-addressable bus nodes;
  performing the following steps by all auto-addressable bus nodes (SL1, SL2, SL3), hereunder referred to as the respective auto-addressable bus node (SLj):
    receiving the respective auto addressing instruction from the bus master (ECU) via the respective auto-addressable bus node (SLj);
    receiving the to-be-assigned bus node address from the bus master (ECU) via the respective auto-addressable bus node (SLj);
    switching off optionally existing bus node base current sources (S1, R3, d1) within the respective auto-addressable bus node (SLj);
    receiving a start signal for the assigning of the to-be-assigned bus node address from the bus master (ECU) via the respective auto-addressable bus node (SLj), and starting a timer by the respective auto-addressable bus node (SLj);
    feeding the bus input current ($i_{(j+1)}$) received from the subsequent bus nodes (SL(j+1), SL(j+2) . . . ) into the bus node output of the respective auto-addressable bus node (SLj) as a part of the bus node output current ($i_j$) of the respective auto-addressable bus node (SLj);
    detecting the value of the bus node output current ($i_j$) of the respective auto-addressable bus node (SLj) with the aid of measurement circuit (R2, D1, D3);
    generating a control signal ($rw_j$) from the detected value of the bus node output current ($i_j$) of the respective auto-addressable bus node (SLj) with the aid of controlling means (F);
    adjusting the bus node output current ($i_j$) through the respective auto-addressable bus node (SLj) by means of a controlled addressing current source (Iqj) whose addressing current is a part of the bus node output current ($i_j$), to a predetermined summated current value ($I_{ref}$) in dependence on the generated control signal (rwj),
    wherein an increase of the addressing current of the controlled auto addressing current source (Iqj) of the respective auto-addressable bus node (SLj) takes place with a first time constant ($\tau_1$), and
    wherein a decrease of the addressing current of the controlled auto addressing current source (Iqj) of the respective auto-addressable bus node (SLj) takes place with a second time constant ($\tau_2$), and
    wherein the second time constant ($\tau_2$) is smaller than the first time constant ($\tau_1$);
    comparing the control value (rj) of the respective auto-addressable bus node (SLj) to a threshold value (SWj) of the respective auto-addressable bus node (SLj);
    freezing the control of the addressing current source (Iqj) of the respective auto-addressable bus node (SLj) at a first time point $t_1$ after the start of the timer;
    taking over the to-be-assigned bus node address from the bus master (ECU) as the valid bus node address of the respective auto-addressable bus node (SLj) when a minimum time has passed since the start of the timer and when the comparison of the control value (rj) to a threshold value (SWj) has the result that the amount of the addressing current of the addressing current source (Iqj) of the respective auto-addressable bus node (SLj) is above a current threshold value, and configuration of the respective auto-addressable bus node (SLj) as a standard bus node without auto addressing capability with the to-be-assigned bus node address as the bus node address of the respective auto-addressable bus node (SLj) at a later time point $t_2$ after the first time point $t_1$, whereby this auto-addressable bus node (SLj) will, for the time being, not participate anymore in the subsequent initialization sequences;
verifying the successful address assignment by the bus master (ECU);
optionally, cancellation of the validity of the last assigned bus node address, whereby the respective auto-addressable bus nodes (SLj) behave again like auto-addressable bus nodes (SLj) without valid bus node addresses;
examining whether all auto-addressable bus nodes have obtained a valid bus node address;
performing a further initialization sequence in case that not all auto-addressable bus nodes have obtained a valid bus node address.

According to a variant of the proposed method, the second time constant ($\tau_2$) is smaller than the first time constant ($\tau_1$) by a factor larger than 10, preferably larger than 100. According to a further variant of the method, the first time constant ($\tau_1$) within the respective auto-addressable bus node (SLj) is dependent on the value—detected with the aid measurement circuit (R2, D1, D3)—of the bus node output current ($i_j$) of the respective auto-addressable bus node (SLj). For example, it is of advantage if, at the start when the total current through the bus shunt resistor is still very small, the first time constant ($\tau_1$) is very short and, thus, the addressing current source of the respective auto-addressable bus node will increase the current very quickly whereas, later, the addressing current of the addressing current source will be increased slowly. It can thus be conceived that the first time constant ($\tau_1$) within the respective auto-addressable bus node (SLj) is dependent on the value of the bus node output current ($i_j$)—detected by measurement circuit (R2, D1, D3)—of the respective auto-addressable bus node (SLj) in such a manner that the value of the first time constant ($\tau_1$) for a value of the bus node output current ($i_j$) below a threshold value has a first value and for a value of the bus node output current ($i_j$) above the threshold value has a second value. Of course, it can also be conceived that the second time constant ($\tau_2$) within the respective auto-addressable bus node (SLj) is dependent on the value of the bus node output current ($i_j$)—detected by measurement circuit (R2, D1, D3)—of the respective auto-addressable bus node (SLj).

Now, in order to be able to detect a mix-up between the LIN input and the LIN output, a variant of the method preferably includes the examining of the detected value of the bus node output current ($i_j$) of the respective auto-addressable bus node (SLj) for plausibility and the initiating of measures if the detected value of the bus node output current ($i_j$) of the respective auto-addressable bus node (SLj) is not plausible.

According to a further refinement, a countermeasure can then be taken by newly defining the infeed point of the addressing current if the detected value of the bus node output current ($i_j$) of the respective auto-addressable bus node (SLj) is not plausible.

Apart from these compensatory measures, there can also be performed a signaling of an error via the data bus upon request by a bus master if the detected value of the bus node output current ($i_j$) of the respective auto-addressable bus node (SLj) is not plausible.

A further measure which is required for stabilization of the control circuit can consist in a refinement of the performance of the step of detecting the value of the bus node output current ($i_j$) of the respective auto-addressable bus node (SLj) with the aid of measurement circuit (R2, D1, D3). Preferably, detection of the value of the bus node output current ($i_j$) of the respective auto-addressable bus node (SLj) with the aid of measurement circuit (R2, D1, D3) is performed with a first sign if the detected value of the bus node output current ($i_j$) of the respective auto-addressable bus node (SLj) is plausible, and detection of the value of the bus node output current ($i_j$) of the respective auto-addressable bus node (SLj) with the aid of measurement circuit (R2, D1, D3) is performed with a second sign that is inverse to the first sign if the detected value of the bus node output current ($i_j$) of the respective auto-addressable bus node (SLj) is plausible.

A further method-related measure can reside in the use of a predetermined error address as a valid bus node address of the respective auto-addressable bus node (SLj) if the detected value of the bus node output current ($i_j$) of the respective auto-addressable bus node (SLj) is not plausible. This error address can be predetermined by design or e.g. be provided per broadcast message via the bus master (ECU).

There is thus proposed a data bus system with bus nodes (SL1, SL2, SL3) for a serial data bus that each comprises a respective shunt bus resistor (R2) which is respectively included in the data bus. Further, they shall comprise an addressing current source (Iq1, Iq2, Iq3) for detecting the bus position of the bus node in the data bus, which can additionally feed an addressing current into the data bus in a controlled manner to the effect that the total current (i1, i2, i3) through the shunt bus resistor (R2) of the bus node (SL1, SL2, SL3) corresponds to a summated current ($I_{ref}$) which is predetermined or computed or defined in some other manner. The control in this regard is performed by said control circuit (R2, D1, D3, F, Iq1, Iq2, Iq3). In the process, the addressing current will flow through the shunt bus resistor (R2) of the respective auto-addressable bus node. In this context, a variant of the proposed bus node comprises measurement circuit (R2, D1) for detecting the current through the shunt bus resistor (R2), which can include the detecting of a measurement value. This detected current through the shunt bus resistor (R2) can be used for a self-test in such a manner that the above described errors (e.g. bus shunt resistance disconnection) can be detected.

According to a further variant of the device, the latter comprises a detection device (DET) which is operative to detect internal signals (ds1, ds3) of the bus node (SLx) for plausibility. In this respect, reference is to be made to the description of the Figures.

Finally, also further examinations can be performed with respect to the correctness of the data bus system, as described e.g. in WO-A-2005/050924.

In this case, the bus node (SLx) or a partial device (DET) of the bus node (SLx) is designed to the effect that it will take measures if the detection device (DET) does not detect plausible internal signals within the bus node. For possible measures, reference is to be made here to the following description of the Figures.

For example, a bus node according to the disclosure comprises a partial device (MUX) which can change the infeed point of the addressing current of the addressing current source (Iqx). By way of alternative to an addressing current source (Iqx) and a multiplexer (MUX), a bus node (SLx) according to the disclosure can also comprise a first addressing current source (Iqx1) and a second addressing current source (Iqx2), wherein the first addressing current source (Iqx1), when feeding current, will feed its current into a node connected to the first connecting point of the bus shunt resistor (R2), and the second addressing current source (Iqx2), when feeding current, will feed its current into a node connected to the second connecting point of the bus shunt resistor (R2). To render the auto addressing possible, only one of the two addressing current sources (Iqx1, Iqx2) will feed the auto addressing current while the other one will preferably feed no current. Preferably, thus, the two addressing current sources (Iqx1, Iqx2) will feed their currents in such a manner that the addressing current will flow through the bus shunt resistor (R2) preferably in the direction toward the bus master (ECU).

According to a further, particularly preferred variant of the auto-addressable bus node, the addressing current source (Iqx1, Iqx2, Iqx3) feeding the addressing current will increase the addressing current by a first time constant ($\tau_1$) and will lower it by a second time constant ($\tau_2$) which is smaller or larger than the first time constant ($\tau_1$).

For improving the electromagnetic compatibility (EMC) behavior, it is proposed to design a method for the assigning of bus node addresses within a serial data bus comprising a chain of bus nodes (SL1, SL2, SL3) and bus master (ECU) e.g. in the manner described above. The following principle for improving the EMC behavior can, however, also be applied to auto addressing methods as are known e.g. from the documents DE-B-10 256 631, EP-B-1 603 282, U.S. Pat. No. 7,590,140 EP-B-1 490 772 and EP-B-1 298 851.

In this case, the bus nodes (SL1, SL2, SL3) can be auto-addressable bus nodes or standard bus nodes. The data bus comprises a bus master (ECU). Each bus node (SL2, SL3) has a preceding bus node (SL1, SL2) unless it is the first bus node (SL1). Each bus node (SL2, SL3) is connected to its preceding bus node (SL1, SL2) by the data bus unless it is the first bus node (SL1). The first bus node (SL1) is connected to the bus master (ECU) by the data bus. Each bus node (SL2, SL3) will send a bus node output current (i2, i3) to its preceding bus node (SL1, SL2) via a bus node output unless it is the first bus node (SL1). The first bus node (SL1) will send a bus node output current (i1) to the bus master (ECU) via a bus node output. Each bus node (SL1, SL2) will receive a bus node input current (i2, i3) from its subsequent bus node (SL2, SL3) via a bus node input unless it is the last bus node (SL3).

The method for the assigning of bus node addresses within a serial data bus comprising a chain of bus nodes (SL1, SL2, SL3) and bus master (ECU) will then, according to the disclosure, comprise the following steps:

- including one assigned bus shunt resistor (R2) per auto-addressable bus node (SL1, SL2, SL3), which is a part of the respective auto-addressable bus node (SL1, SL2, SL3), into the serial data bus by opening a bus shunt bypass switch (S4) within the respective auto-addressable bus node (SL1, SL2, SL3) which is assigned to the assigned bus shunt resistor (R2). It is evident that this inclusion will take place only if the bus shunt bypass switch (S4) of the respective bus shunt resistor (R2) is not opened yet. In the framework of this application, it is assumed that, at the start of the addressing sequence, the respective bus shunt resistor (R2) of an auto-addressable bus node (SL1, SL2, SL3) has been bypassed by the respective bus shunt bypass switch (S4) and has been removed from the data bus;
- detection and assignment of a bus node address for at least one of the auto-addressable bus nodes (SL1, SL2, SL3), the newly addressed bus node, with the aid of the assigned bus shunt resistors (R2) which are not bypassed by their assigned bus shunt bypass switch (S4);
- bypassing the assigned bus shunt resistor (R2) of the newly addressed auto-addressable bus node (SL1, SL2, SL3) by closing the bus shunt bypass switch (S4) which is assigned to the assigned bus shunt resistor (R2) of the newly addressed auto-addressable bus node (SL1, SL2, SL3), wherein the newly addressed auto-addressable bus node (SL1, SL2, SL3), after the assignment of the bus node address to the newly addressed auto-addressable bus node (SL1, SL2, SL3) and the closing of its assigned bus shunt bypass switch (S4), will behave like a standard bus node until an event which will terminate this behavior of the newly addressed auto-addressable bus node (SL1, SL2, SL3). Such an event can be e.g. a broadcast instruction to all auto-addressable bus nodes instructing them to open these bus shunt bypass switches (S4), or a reset of the bus system or a voltage drop of the supply voltage. Preferably, opening the bus shunt bypass switch (S4) will lead to invalidation of the assigned bus node address of the respective auto-addressable bus node (SL1, SL2, SL3);
- optionally, repeating the detection and assignment of a bus node address for at least one further auto-addressable bus node (SL1, SL2, SL3) and optionally bypassing the assigned bus shunt resistor (R2) of the further newly addressed auto-addressable bus node (SL1, SL2, SL3) by means of the assigned bus shunt bypass switch (S4) until optionally all auto-addressable bus nodes (SL1, SL2, SL3) have received a bus node address. Of course, this process can also be terminated without all auto-addressable bus nodes (SL1, SL2, SL3) having received a bus node address. Normally, however, this would not be reasonable.

For making it possible to perform the above described method, there is provided a bus node in accordance with the disclosure that is capable of performing a method for the assigning of bus node addresses to bus nodes of a serial data bus, wherein the method for the assigning of bus node addresses to bus nodes of a serial data bus system is performed with the aid of bus shunt resistors (R2) in the individual bus nodes (SL1, SL2, SL3) in an assignment time period and wherein, after to the method for the assigning of bus node addresses to the bus nodes of the serial data bus system in the assignment time period, there follows an operating time period. For this purpose, the bus node comprises such a bus shunt resistor (R2). According to the disclosure, it comprises a bus shunt bypass switch (S4) which, prior to assigning a bus node address to the bus node in the assignment time period is opened and which after the assignment of bus node address to the bus node in the assignment time period is closed, and which is closed in the operating time period.

The proposed method and the proposed bus node allow for an auto addressing according to any one of the above mentioned methods (bus shunt method=BSM auto addressing) as are disclosed e.g. in the documents DE 10 256 631 B4, EP 1 603 282 B1, U.S. Pat. No. 7,590,140 B2, EP 1 490 772 B1, EP 1 298 851 B1 and the still unpublished German patent application DE 10 2017 122 364.9. By the shunt bypass switch (S4), the resistance in normal operation after the auto addressing has been performed will be reduced to a minimum while, in addressing operation, the resistance value will allow for a good and robust auto addressing.

The advantages, however, are not limited to those mentioned above.

LIST OF FIGURES

FIG. 1 is a simplified schematic view of a bus system according to the disclosure, wherein the measuring of the summated current is performed by measuring the summated current at a shunt resistor in the bus input of the respective auto-addressable bus node (SL1, SL2, SL3), FIGS. 2 to 4
  show the development of the output currents (i1, i2, i3) of the bus nodes (SL1, SL2, SL3) and of the currents of the addressing current sources (Iq1, Iq2, Iq3) for different time constants of the control, FIG. 5 is a simplified schematic view of a bus system of the configuration A comprising two standard bus nodes (CS1, CS2) which have no auto addressing capability, FIG. 6 is a simplified schematic view of a bus system of the configuration B comprising two standard bus nodes (CS1, CS2) which have no auto addressing capability, FIG. 7 is a simplified schematic view of a bus system of the configuration C comprising two standard bus nodes (CS1, CS2) which have no auto addressing capability, FIG. 8 shows the case of the reversal of the second bus node (SL2), FIG. 9 shows the situation according to FIG. 8 after detection of a mix-up of the LIN inputs and outputs and the performing of countermeasures, FIG. 10 shows, in detailed form, the second auto-addressable bus node (SL2) of FIGS. 8 and 9, now as an x-th auto-addressable bus node (SLx), FIG. 11 shows, in detailed form, the second auto-addressable bus node (SL2) of FIGS. 8 and 9, now as an x-th auto-addressable bus node (SLx), notably in the state of connection to the bus according to a first of two possibilities, FIG. 12 corresponds to FIG. 5 and is a simplified schematic view of a bus system of the configuration A comprising two standard bus nodes (CS1, CS2) which have no auto addressing capability, and auto-addressable bus nodes (SL1, SL2, SL3) each having a bus shunt bypass switch (S4) and a receiver (Rec), and FIG. 13 shows a bus node with connected application.

Figure 1:
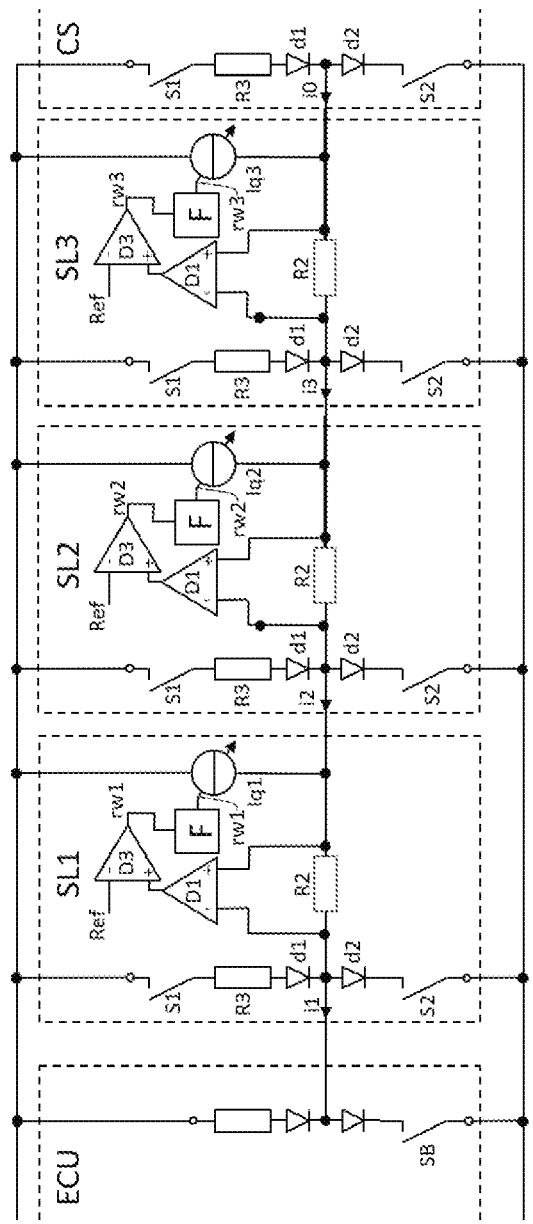
FIG. 1 is a simplified schematic view of a bus system according to the disclosure.

At the start of the auto addressing, the bus master (ECU) will signal to all auto-addressable bus nodes that the bus node addresses are to be assigned. The following address assignment is split into address assignment phases, wherein, in each address assignment phase, exactly by means of one initialization run, preferably exactly one auto-addressable bus node, namely the last auto-addressable bus node (SL1, SL2, SL3) as viewed from the bus master (ECU) in the bus node chain that has not yet received a bus node address, will receive a valid bus node address from the bus master (ECU). Preferably, the bus master, by means of a so-called broadcast instruction, will transmit to all auto-addressable bus nodes the number of standard bus nodes which are arranged before the auto-addressable bus nodes (SL1, SL2, SL3), i.e. between these and the bus master (ECU), or a maximum auto addressing current level. Of course, this maximum auto addressing current level $I_{amax}$ can also be programmed into the bus node because, as known, the bus topology is typically determined by design and not operation-dependent and thus is predictable. Herein, it is defined which summated current ($I_{ref}$) shall flow through the bus shunt resistor (R2).

At the start of each address assignment phase, the bus master (ECU) will again close its switch (SB) for a predetermined addressing time TA. Normally, this current sink (SB) of the bus master (ECU) is actually a more complex structure which can also detect a bus short circuit and is here illustrated only in simplified form. In this manner, the bus master (ECU) provides a current sink for the addressing current of the addressing current sources and for the bus node base currents of the bus nodes in the following address assignment period. The auto-addressing-capable auto-addressable bus nodes (SL1), (SL2) and (SL3) will register that the data bus is pulled toward ground and will open their respective switches S1 and S2. Thus, the auto-addressable bus nodes (SL1, SL2, SL3) will not feed any bus node base current into the data bus anymore.

After expiration of a first time period (dt1), the auto-addressable bus nodes will determine the base current through the respective bus shunt resistor (R2) by measuring the voltage drop across this bus shunt resistor (R2). This voltage drop can e.g. be temporarily stored as an offset voltage value in a sample and hold circuit and subsequently, with the aid of a subtraction circuit, be subtracted from the later measured voltage drop across the bus shunt resistor (R2). Thereby, it is safeguarded that only the bus current deviating from the respective base current is used for the address assignment and the control of the addressing current sources (Iq1, Iq2, Iq3).

This phase will be terminated after expiration of a second time period (dt2).

All auto-addressable bus nodes which do not yet have a valid bus node address will detect the current deviating from the base current by their respective bus shunt resistor (R2) and subsequently, on the basis of the thus obtained bus current measurement value, will now adjust their respective addressing current source (Iq1, Iq2, Iq3) in such a manner that the current through their respective bus shunt resistor (R2) will correspond to their previously detected or predefined summated current ($I_{ref}$). For this purpose, the respective auto-addressable bus node is provided with measurement circuit (R2, D1, D3) for detecting the real summated current in the form of the respective bus node output current (i1, i2, i3) in the direction toward the bus master (ECU). Herein, the voltage drop across the bus shunt resistor (R2) will be detected and preferably, after deduction of the voltage value for the bus base current, will be further processed as a summated current signal. As already explained, the thus generated summated current signal will be filtered, in a preferably non-linear filter (F), to become a control signal. The latter will be compared to a reference value (Ref) with the aid of a differential amplifier stage, which in effect corresponds to a comparison of the respective bus node output current (i1, i2, i3) to a reference current ($I_{ref}$). Thus, when setting or computing the reference current ($I_{ref}$), there will actually typically be determined this reference value (Ref). This comparison can be performed before and after the filtering in the filter (F). Preferably, this is a difference formation. Further, after this comparison, a further filtering can be performed which is not represented in the Figures. The thus detected control value (rw1, rw2, rw3) will then control the respective addressing current source (Iq1, Iq2, Iq3) of the respective auto-addressable bus node (SL1, SL2, SL3).

Since the summated current at the output of the respective auto-addressable bus node (SL1, SL2, SL3) shall always be constant, only the last auto-addressable bus node (SL3) will finally deliver electric current into the data bus while all other addressing current source (Iq1, Iq2) of the other auto-addressable bus nodes (SL1, SL2) have been controlled downward by the controllers (R2, D1, D3, F) of the other auto-addressable bus nodes (SL1, SL2). This has the consequence that the control value (rw3) of the last bus node (SL3), due to the control values (rw1, rw2) of the other bus nodes (SL1, SL2), is different in that it will control the addressing current source (Iq3) of its bus node (SL3) fully upward, while the control values (rw1, rw2) of the preceding bus nodes (SL1, S12) have values to the effect that they will control their addressing current sources (Iq1, Iq2) downward. Thus, each bus node (SL1, SL2, SL3) can compare this control value (rw1, rw2, rw3) to a preceding—preferably substantially equal—threshold value (SW).

This phase will end after a third time period (dt3).

The end of this addressing phase is preferably marked by the opening of the current sink switch (SB). Thereby, the data bus is again brought toward the supply voltage. The bus nodes (SL1, SL2, SL3) will then preferably freeze the status of their respective control value (rw1, rw2, rw3) and evaluate it in comparison to said threshold value (SW) and then, on this basis, will decide whether they are the last auto-addressable bus node (here, SL3) in the bus node chain (SL1, SL2, SL3) or a preceding bus node (SL1, SL2). If they are the last bus node (SL3), they will take over the to-be-assigned bus node address signaled at the very beginning by the bus master (ECU), which they have preferably stored in a suitable memory after reception for this case. This auto-addressable bus node (SL3) will then not take part anymore in further auto addressing phases in the form of initialization runs. This means that this auto-addressable bus node (SL3) will then not feed any addressing current by means of its addressing current source (Iq3) into the data bus anymore. Of course, it will then also not take over anymore the further auto-addressable bus nodes offered by the bus master (ECU) because it does have a valid auto-addressable bus node now and shall behave like a standard bus node until its valid bus node address becomes invalid. The bus node address of an auto-addressable bus node will become invalid e.g. at a voltage drop of the operating voltage below an operating voltage threshold value or e.g. due to an instruction of the bus master or due to some other signaling.

Preferably, the bus master will check the successful address assignment at the end of each initialization run.

Then, there follows the addressing phase in the form of a subsequent initialization run in which the next, now the last, not-yet-addressed addressable bus node (SL2) will receive its bus node address in the same way. The process is performed in an analogous manner. This addressable bus node (SL2), just as the auto-addressable bus node (SL3) first provided with a valid bus node address, will not take part anymore in further addressing phases in the form of subsequent initialization runs. It will then behave like a standard bus node. This means that it will not feed an addressing current by means of its addressing current source (Iq2) into the data bus anymore. Of course, it will then also not take over anymore the further to-be-assigned bus node addresses offered by the bus master (ECU) because, then, it does have a valid bus node address. This will be continued until all auto-addressable bus nodes have received a valid bus node address.

Figure 2:
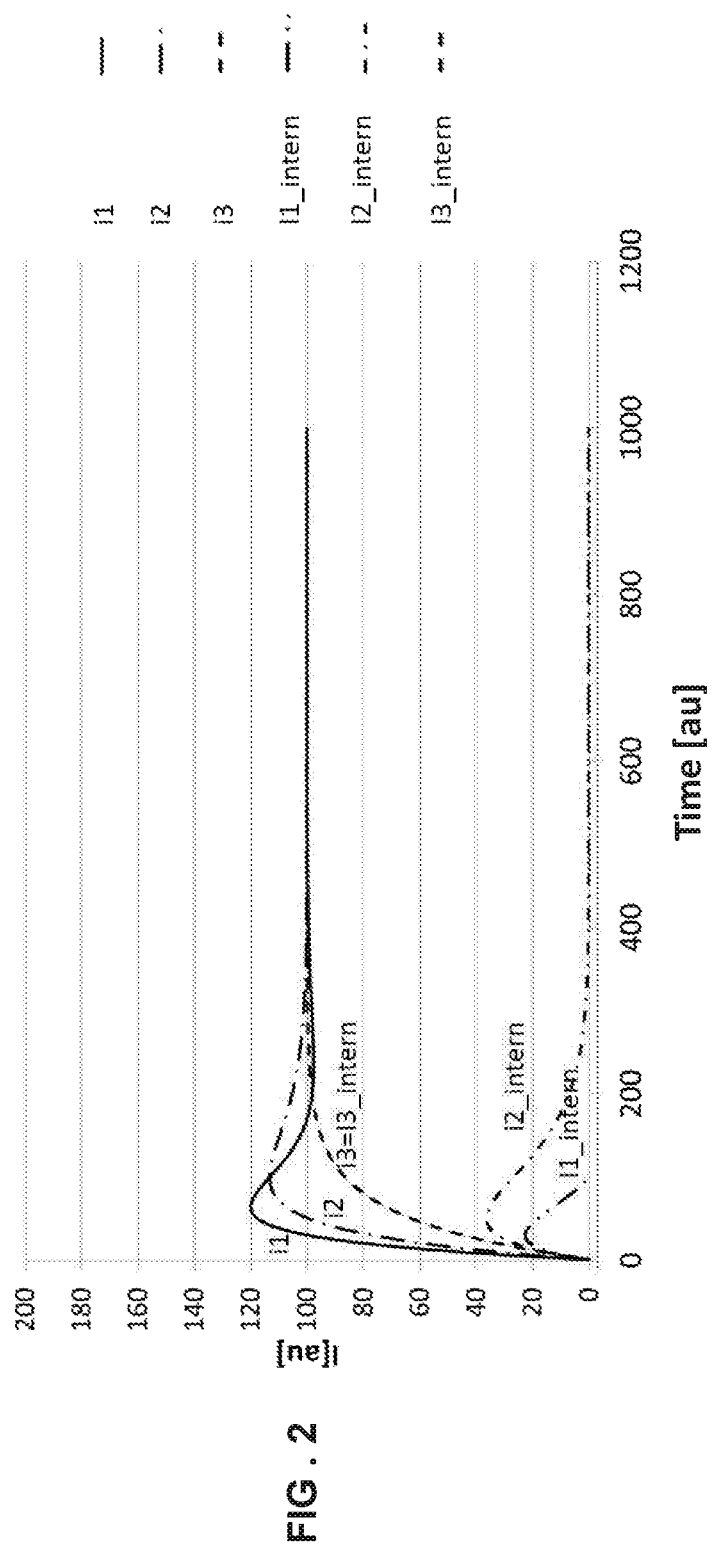

FIG. 2 shows the development of the output current (i1) of the first bus node (SL1), the output current (i2) of the second bus node (SL2) and the output current (i3) of the third bus node (SL3). Further shown is the current (I1_intern) of the addressing current source (Iq1) of the first bus node (SL1), the current (I2_intern) of the addressing current source (Iq2) of the second bus node (SL2) and the current (I3_intern) of the addressing current source (Iq3) of the third bus node (SL3). Here, the time constants for the upward control of the addressing current sources and for the downward control of the addressing current sources are substantially equal. An overmodulation is caused. It is easily visible that, by the controllers of these auto-addressable bus nodes, the current (I1_intern) of the addressing current source (Iq1) of the first bus node (SL1) and the current (I2_intern) of the addressing current source (Iq2) of the second bus node (SL2) are controlled downward while the current (I3_intern) of the addressing current source (Iq3) of the third bus node (SL3) is controlled toward the reference value. The time for initial transient oscillation is determined—other than in DE-B-10 2010 026 431 only by the first time constant ($\tau_1$).

Figure 3:
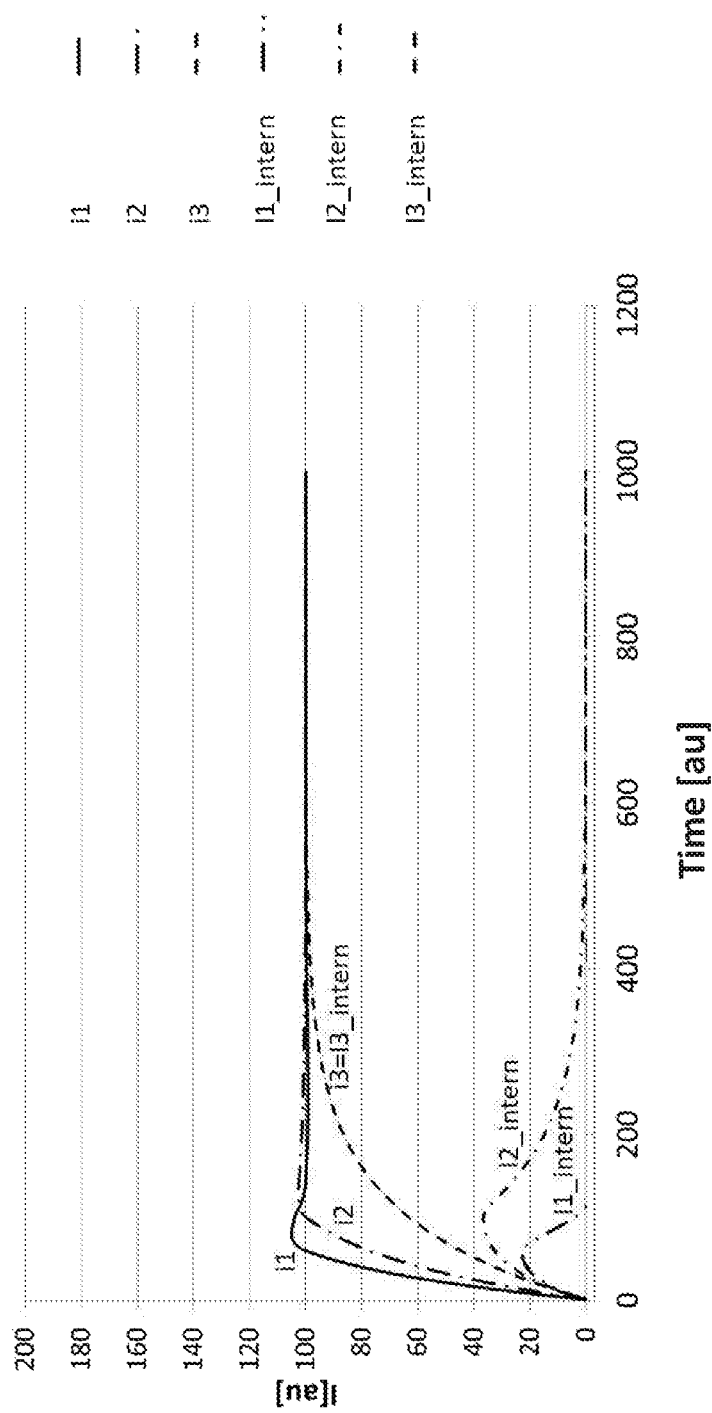

FIG. 3 shows the development of the output current (i1) of the first bus node (SL1), the output current (i2) of the second bus node (SL2) and the output current (i3) of the third bus node (SL3). Further shown is the current (I1_intern) of the addressing current source (Iq1) of the first bus node (SL1), the current (I2_intern) of the addressing current source (Iq2) of the second bus node (SL2) and the current (I3_intern) of the addressing current source (Iq3) of the third bus node (SL3). Here, the time constants for the upward control of the addressing current sources are about ten times as long as the time constants for the downward control of the addressing current sources. A minimal overmodulation is caused.

Figure 4:
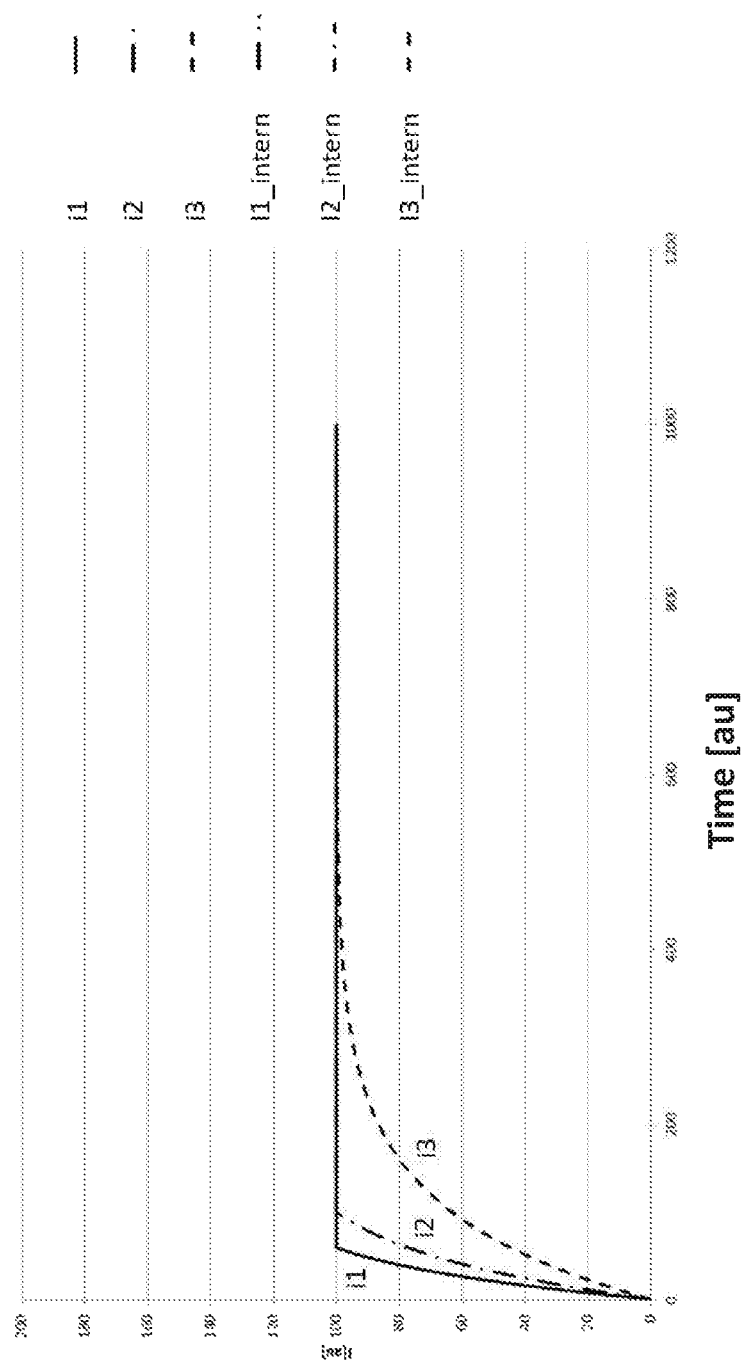

FIG. 4 shows the development of the output current (i1) of the first bus node (SL1), the output current (i2) of the second bus node (SL2) and the output current (i3) of the third bus node (SL3). Further shown is the current (I1_intern) of the addressing current source (Iq1) of the first bus node (SL1), the current (I2_intern) of the addressing current source (Iq2) of the second bus node (SL2) and the current (I3_intern) of the addressing current source (Iq3) of the third bus node (SL3). Here, the time constants for the upward control of the addressing current sources are about one hundred times as long as the time constants for the downward control of the addressing current sources. No overmodulation is caused.

Figure 5:
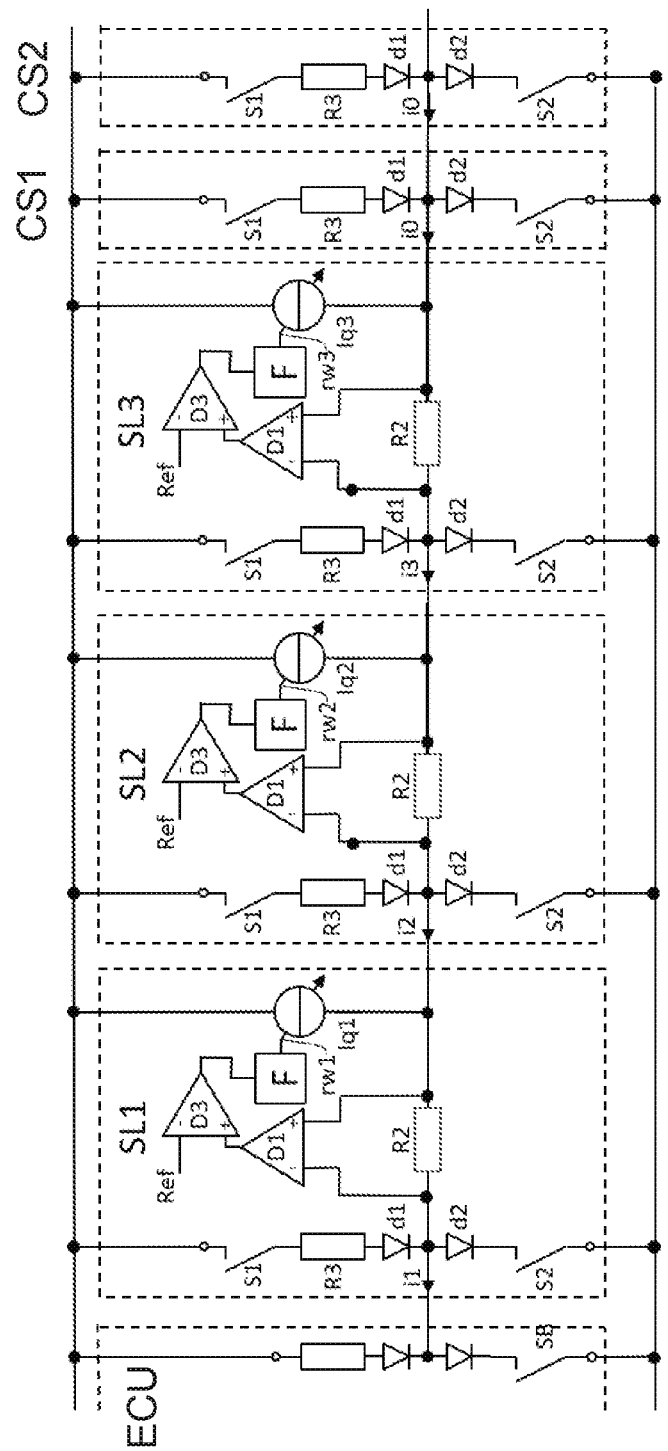

FIG. 5 is a simplified schematic view of a bus system of the configuration A comprising two standard bus nodes (CS1, CS2) which have no auto addressing capability.

Figure 6:
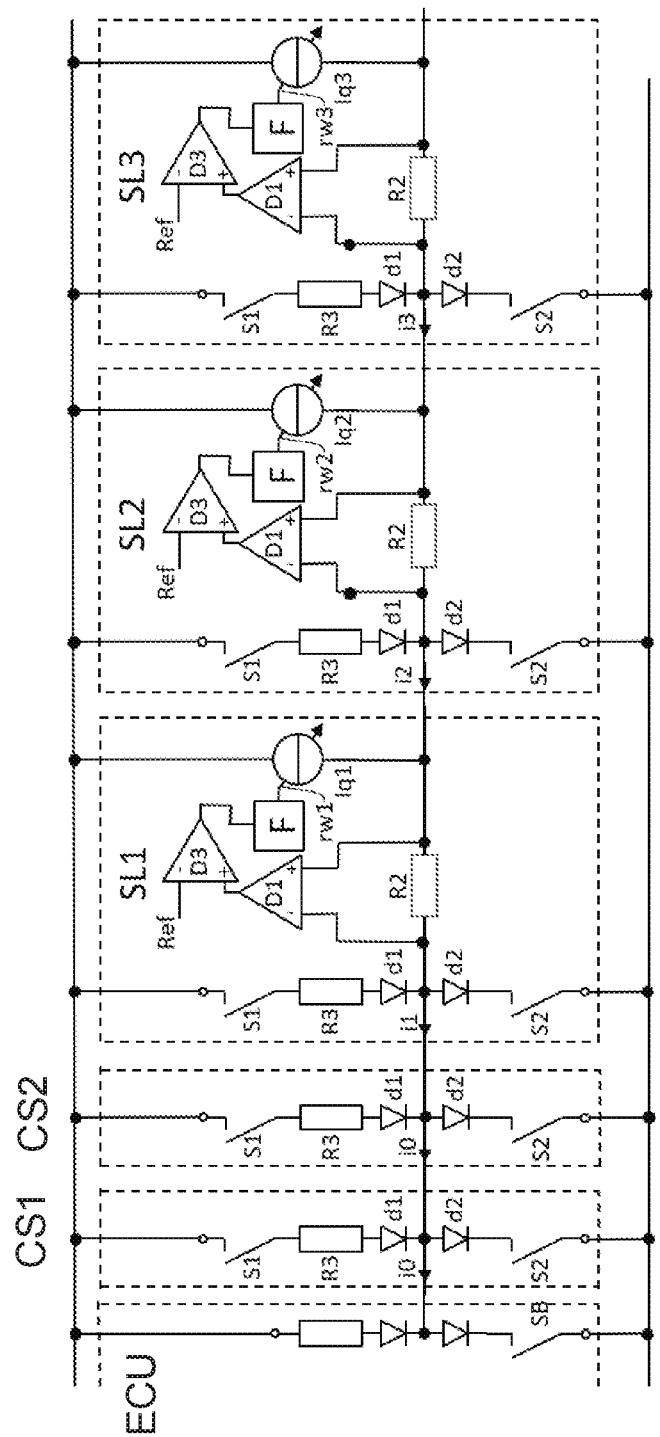

FIG. 6 is a simplified schematic view of a bus system of the configuration B comprising two standard bus nodes (CS1, CS2) which have no auto addressing capability.

Figure 7:
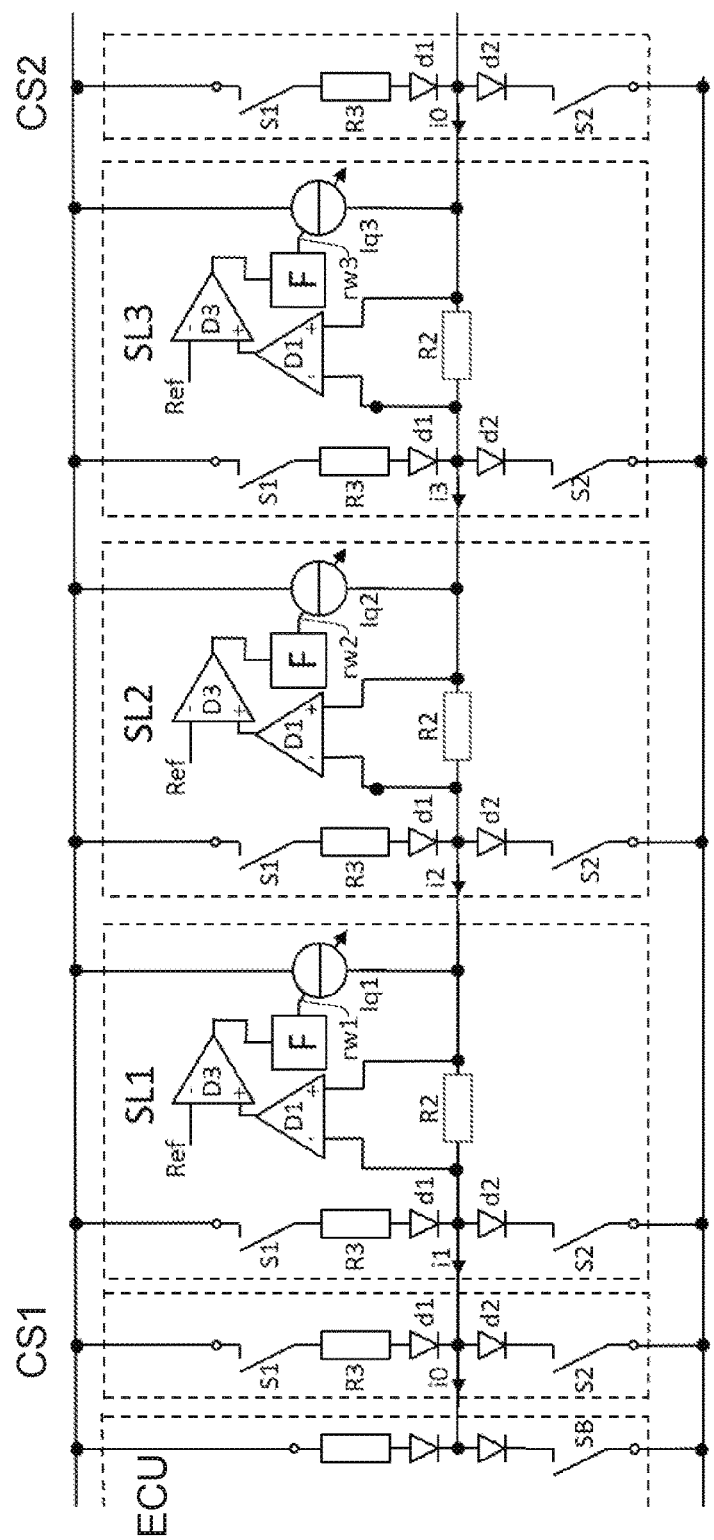

FIG. 7 is a simplified schematic view of a bus system of the configuration C comprising two standard bus nodes (CS1, CS2) which have no auto addressing capability.

Figure 8:
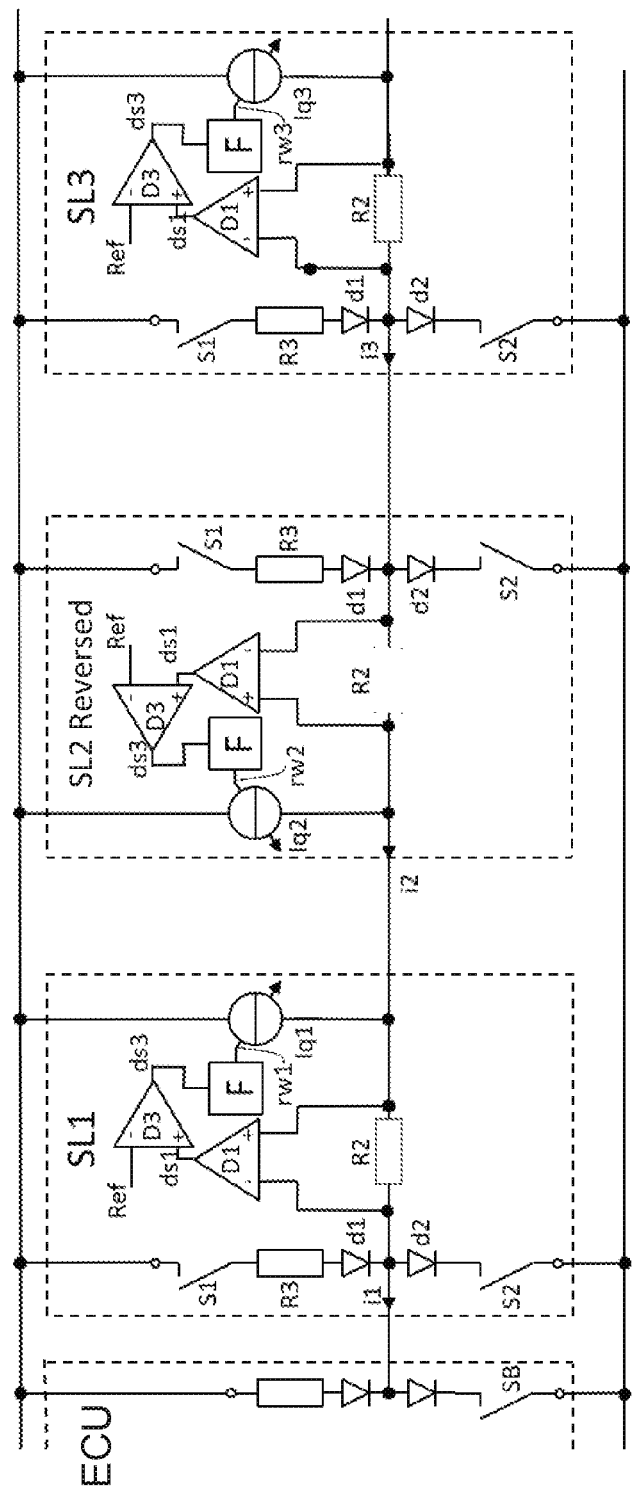

FIG. 8 shows the case of the reversal of the second bus node (SL2). In the second bus node (SL2), in this example, the LIN bus input and the LIN bus output have been switched against each other. This operating condition shall be detected. The exchange has the consequence that the bus shunt current (iR2) through the bus shunt resistor (R2) of this twisted second bus node (SL2) will be fed into the bus shunt resistor (R2) thereof rearward in comparison to the normal situation. In the present example, this bus shunt current (iR2) through the bus shunt resistor (R2) comprises only the bus node output current (i3) of the subsequent, third auto-addressable bus node (SL3) or, in other cases, of the subsequent bus nodes. Thus, this the bus node output current (i3) of the third auto-addressable bus node (SL3) will now lead to a negative voltage drop ($V_{R2}$) across the bus shunt resistor (R2). In the present example, this can be detected by the first differential amplifier (D1) of the twisted auto-addressable bus node (SL2). Its output (ds1), as a consequence of the negative control due to the negative voltage drop ($V_{R2}$) across the bus shunt resistor (R2), is saturated at the smallest possible output level of the differential amplifier (D1). This smallest possible output level of the output (ds1) of the differential amplifier (D1) can be, in regard to its amount, a maximum value of a negative output value or a minimum value of a positive output value. Typically, depending on the design of the first differential amplifier (D1) and its voltage supply, this amount will be near 0 V. Thus, the output (ds1) of the differential amplifier (D1) will typically lie below the level of the reference value (Ref). This will cause a large positive signal at the output (ds3) of the third differential amplifier (D3) and thus, at least after the initial transient oscillation of the non-linear filter (F) of the twisted auto-addressable bus node (SL2), a maximization of the addressing current through the controlled addressing current source (Iq2) of the—here, in this exemplary error case, twisted—second auto-addressable bus node (SL2).

Thus, the control circuit will increase the addressing current which is fed by the addressing current source (Iq2) into the data bus. Herein, now, the problem arises that this addressing current does not flow, as provided, through the bus shunt resistor (R2). Thus, the provided control circuit is interrupted. The current transient through the bus node output current (i3) of the subsequent third auto-addressable bus node (SL3) will therefore not effect, as provided, a positive current transient in the bus shunt resistor (R2) but a negative current transient. Further auto-addressable bus nodes (SL2) situated behind the second auto-addressable bus node (SL2) would give a continued negative bias to the voltage drop across the bus shunt resistor (R2) of the second auto-addressable bus node (SL2).

However, the twisted second auto-addressable bus node (SL2) can detect, by means of the voltage drop ($V_{R2}$) across its bus shunt resistor (R2) that has the voltage amount $|V_{R2}|=|i2R|*|R2|$, that there exists a disproportion between the transient of the addressing current generated by its controlled addressing current source (Iq2) and the normally correlating transient of the voltage drop ($V_{R2}$) across its bus shunt resistor (R2). Apart from this, a sign error exists in this case. Thus, if an x-th auto-addressable bus node (SLx) detects, at an x-th position in the chain of bus nodes, a negative voltage drop ($V_{R2}$) with the aid of its bus shunt resistor (R2) and if its addressing current source (Iq2) should supply a positive current, the respective auto-addressable bus node (SL2) can detect this constellation and take countermeasures.

Particularly, the respective x-th auto-addressable bus node (SLx) has to prevent that, in this error case, the addressing current of its controlled addressing current source (Iqx) and thus the bus node output current (ix) of the respective x-th auto-addressable bus node (SLx) will further increase because the bus node output current (ix), which is the sum of the bus input current and of the addressing current of its controlled addressing current source (Iqx), would exceed the maximum LIN bus current (condition: i1=<40 mA).

In the simplest case, the x-th auto-addressable bus node (SLx) will switch off its addressing current source (Iqx) and will take over a predetermined error address as a bus node address. After the auto addressing has been performed, the bus master (ECU) can send a test request of the bus nodes with this error address as a bus node address, whereupon these will respond by a standardized reply.

Then, the bus master (ECU) can, in the simplest case, signal a bus error to all bus nodes and/or users. However, the bus master (ECU) can also output an instruction to all bus nodes with this error address, whereupon these, first, will change the infeed point of their addressing current e.g. with the aid of a multiplexer (MUX) and, second, will reverse the polarity of the input and alternatively of the output of the first differential amplifier (D1). The bus master (ECU) will then perform a new address assignment. Only if the latter is still faulty, the bus master will preferably signal an error. Optionally, it will switch off, by way of an instruction (broadcast instruction) to the respective error address, the still relevant bus nodes because, in such a case, there obviously exists a different error.

Figure 9:
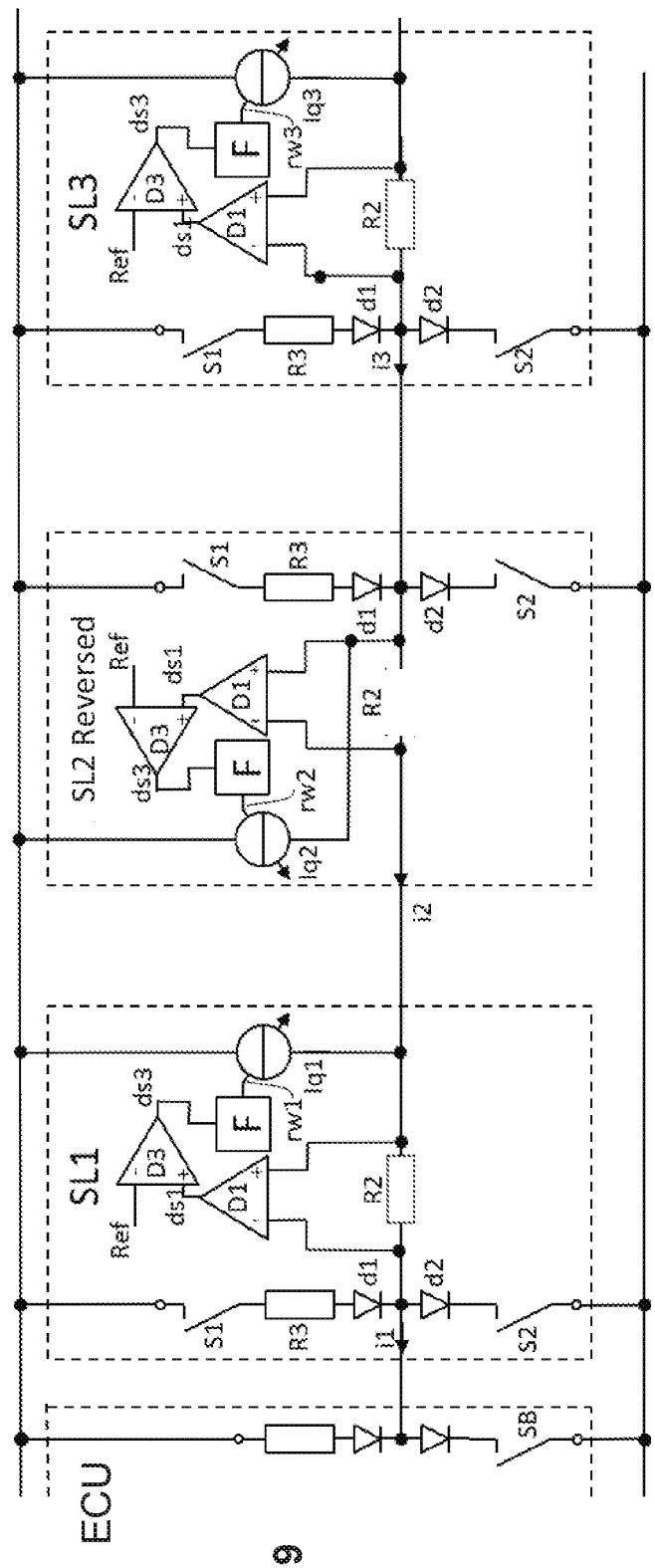

FIG. 9 shows the situation after
a. the detection of a mix-up of the LIN inputs and outputs,
b. the switching of the infeed point of the addressing current of the addressing current source (Iq2) of the present example of a twisted second auto-addressable bus node (SL2), and
c. the reversal of the polarity of the inputs or the alternative exchange of the output of the first differential amplifier (D1).

Figure 10:
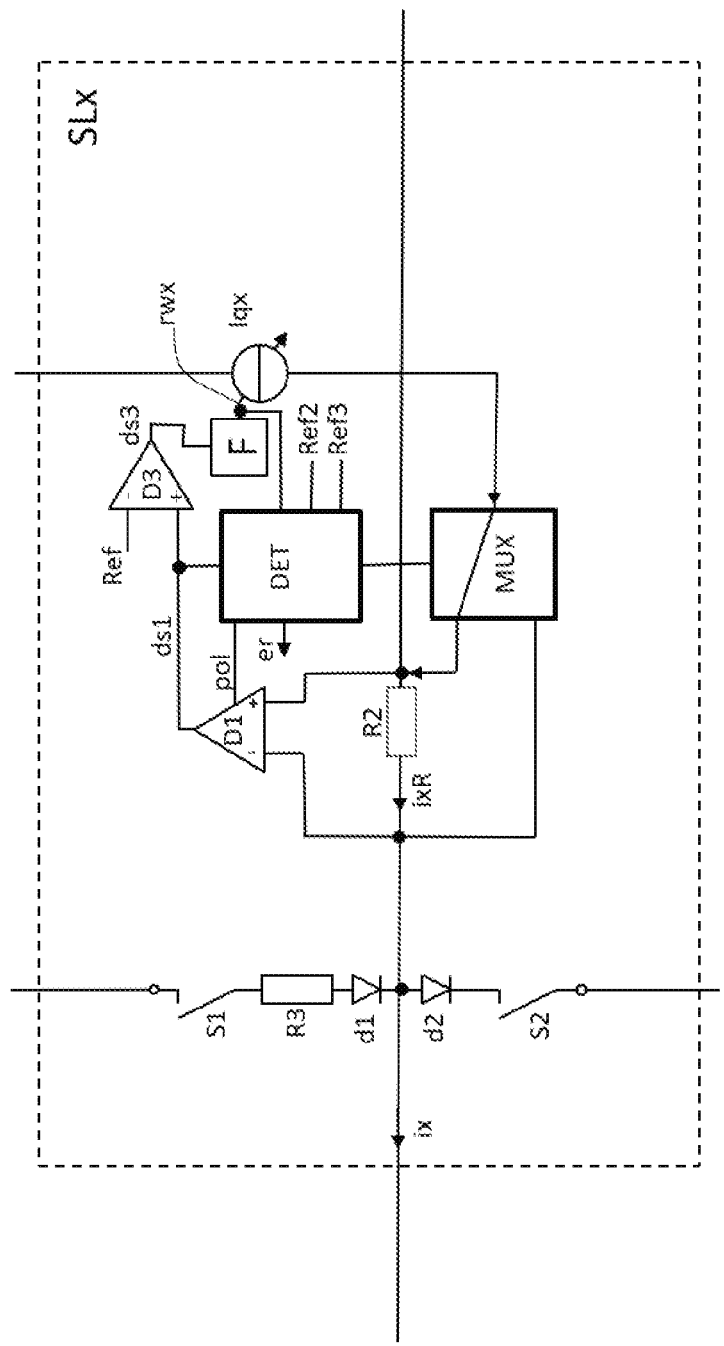

FIG. 10 shows, in detailed form, the second auto-addressable bus node (SL2) of FIGS. 8 and 9, now as an x-th auto-addressable bus node. Here, x stands for a position in the LIN bus chain of the bus nodes in the form of a positive, whole, natural number. This is the x-th auto-addressable bus node (SLx) which is operative
  first, to detect a mix-up of its LIN input with its LIN output, and
  second, in this case, as an exemplary countermeasure, to position the infeed point for the addressing current if its controlled addressing current source (Iqx) in such a manner before or behind the bus shunt resistor (R2) that the auto addressing is possible in dependence the orientation in which the bus node is connected.

For this purpose, the example of the x-th auto-addressable bus node (SLx) shown in FIG. 10 comprises a detection device (DET) which is capable of detecting a mix-up of the LIN input of the x-th auto-addressable bus node (SLx) with the LIN output of the x-th auto-addressable bus node (SLx). For this purpose, the exemplary detection device (DET) examines internal signals of the x-th auto-addressable bus node (SLx) for plausibility. If the internal signals of the x-th auto-addressable bus node (SLx) allow for a reliable conclusion to a mix-up of the LIN input of the x-th auto-addressable bus node (SLx) with the LIN output of the x-th auto-addressable bus node (SLx), the detection device can potentially take various exemplary measures.
a. signaling an error to a user;
b. signaling the error to a bus master (ECU) by means of a response to a diagnosis request (broadcast message);
c. using an error address as bus node address;
d. reconfiguration of the internal topology for neutralization of the error;
e. re-parameterization of internal partial devices such as e.g. current sources for neutralization of the error.
  Also further measures can be envisioned.

In the example according to FIG. 10, a reconfiguration of the internal topology is provided for neutralization of the error. In the exemplary case of FIG. 10, the detection device (DET) will change the infeed point for the addressing current of the controlled addressing current source (Iqx) of the x-th auto-addressable bus node (SLx) e.g. with the aid of an analog multiplexer (MUX) and will reverse the polarity of the inputs or alternately of the output of the first differential amplifier (D1) by means of a polarity signal (pol).

By way of alternative to the example of FIG. 10, a re-parameterization of internal partial devices such as e.g. current sources for neutralization of the error is possible if, instead of an addressing current source (Iqx) of the x-th auto-addressable bus node (SLx) and a multiplexer (MUX), there are used a first addressing current source (Iqx1) of the x-th auto-addressable bus node (SLx) and e.g. a second addressing current source (Iqx2) of the x-th auto-addressable bus node (SLx), among which the first addressing current source (Iqx1) of the x-th auto-addressable bus node (SLx) will feed its addressing current before the bus shunt resistor (R2) and the second addressing current source (Iqx2) of the x-th auto-addressable bus node (SLx) will feed its addressing current behind the bus shunt resistor (R2). In this case, the detection device (DET) will set the addressing current of one of the two current sources (Iqx1, Iqx2) to zero, thus achieving the equivalent effect to the combination of an addressing current source (Iqx) of the x-th auto-addressable bus node (SLx) with the switching by a multiplexer (MUX).

For example, the detection device (DET) can detect that the control value (rwx) of the x-th auto-addressable bus node (SLx) maximizes the addressing current of the addressing current source (Iqx). For instance, with a suitable construction, this can be performed by a comparison of the control value (rwx) to a second threshold value (Ref2). If the derivation of the addressing current of the addressing current source (Iqx) according to the control value (rwx) is positive, this means that the control value (rwx) is above the second threshold value (Ref2). Further, the detection device (DET) can at the same time compare the output (ds1) of the first differential amplifier (D1) to a third reference value. If the output (ds1) of the first differential amplifier (D1) is below a third reference value (Ref3), the detection device can conclude to a negative voltage drop ($V_{R2}$) across the bus shunt resistor (R2) or to a voltage drop ($V_{R2}$) near zero across the bus shunt resistor (R2). This state is illegal because, in fact, the addressing current source is supplying a positive addressing current which, provided that the design is correct, would have to flow through the bus shunt resistor (R2), which, however, obviously does not happen.

Such a detected error can be detected by the detection device (DET) e.g. via an error signal (er) to a bus-node-internal computer or to a suitable control unit.

Figure 11:
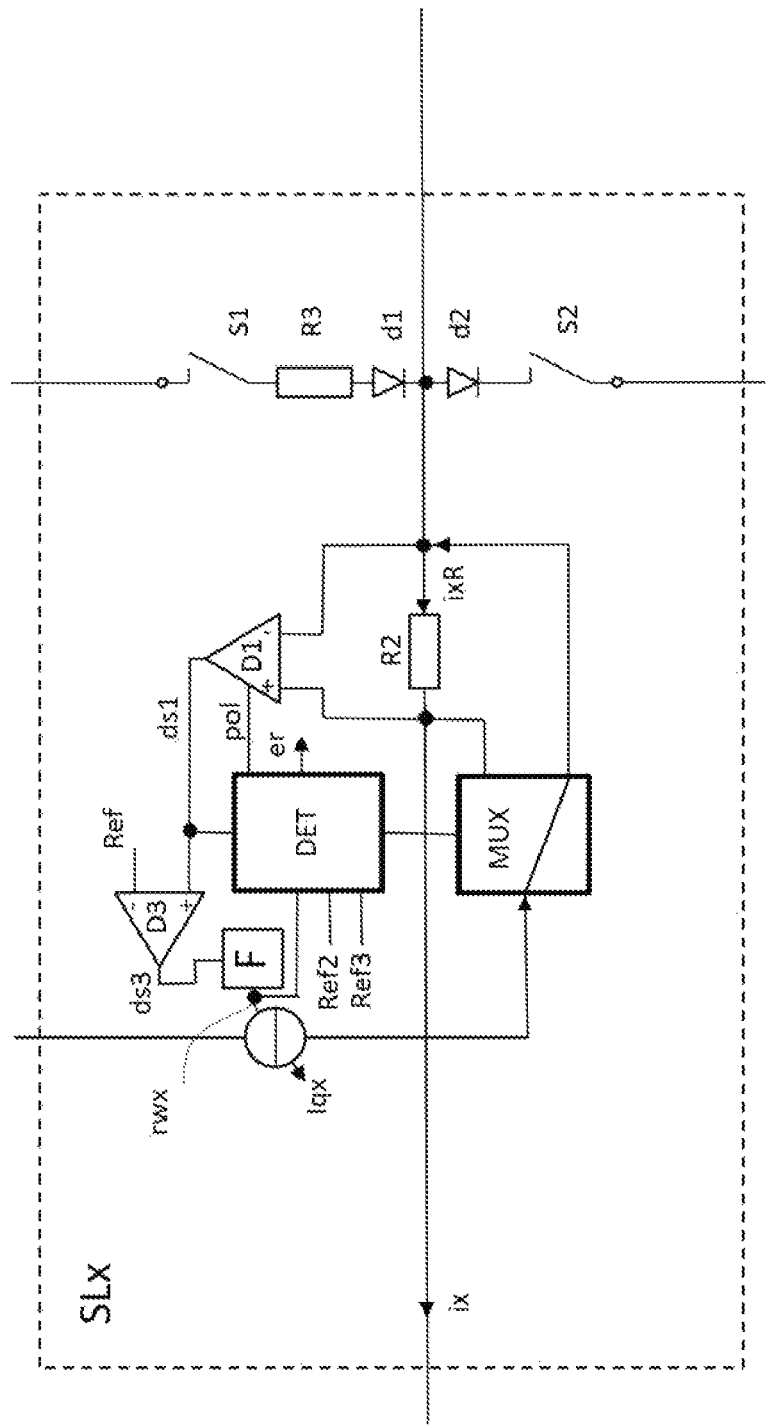

FIG. 11 shows the circuit configuration of the hardware for the controlling of the addressing current source (Iqx) and for the feeding of the auto addressing current into the data bus if the bus node (SLx) is included in the data bus in a "twisted" manner relative to the circuit configuration according to FIG. 10. By suitable control of the multiplexer (MUX), the addressing current will now be infed again behind the bus shunt resistor (R2) relative to the bus master (ECU).

Figure 12:
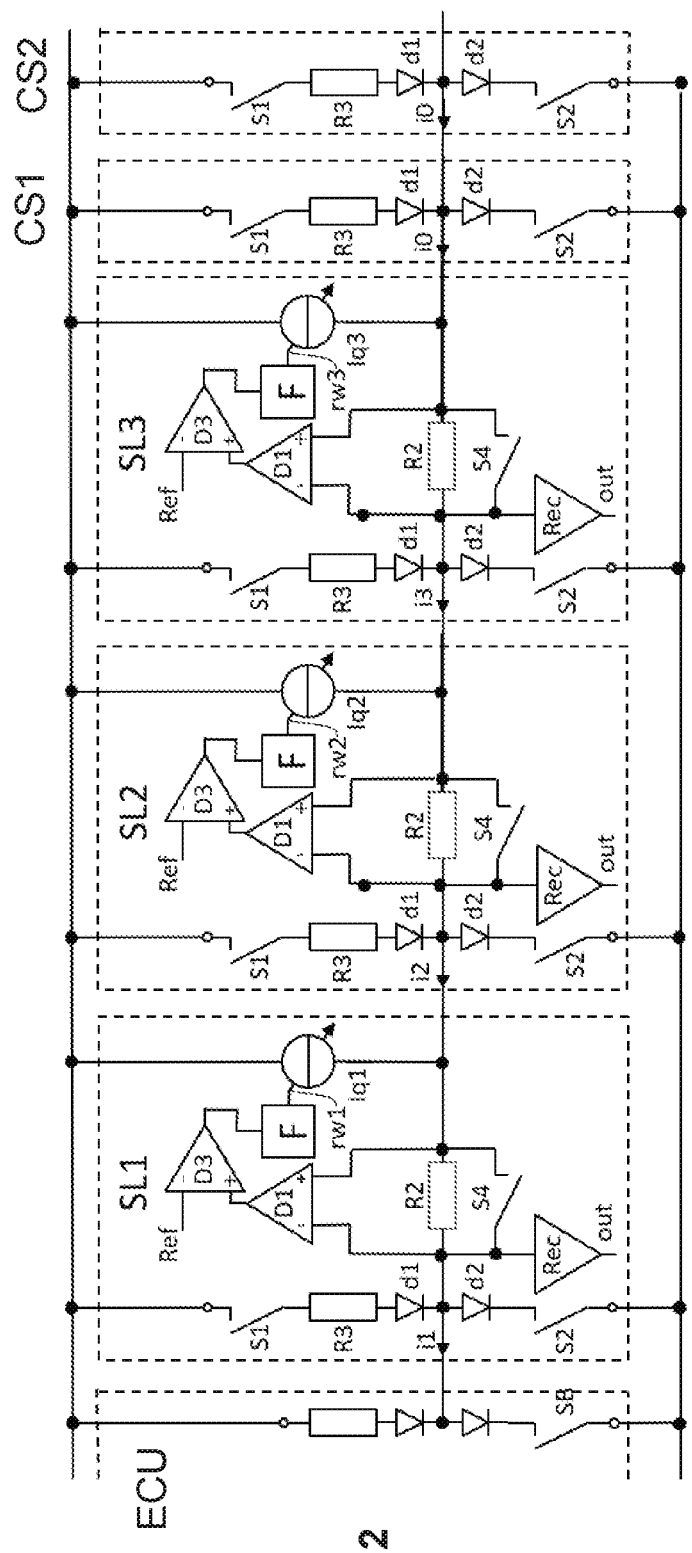

FIG. 12 corresponds to FIG. 5 and is a simplified schematic view of a bus system of the configuration A comprising two standard bus nodes (CS1, CS2) which have no auto addressing capability, and auto-addressable bus nodes (SL1, SL2, SL3) each having a bus shunt bypass switch (S4) and a receiver (Rec). The receiver (Rec) is not represented in the other FIGS. 1, 5, 6, 7, 8 and 9 only for reasons of clearer illustration. Typically, each auto-addressable bus node (SL1, SL2, SL3) is provided with a control unit which is connected to the output of the receiver (Rec) and which typically can receive instructions via the data bus. On the basis of such instructions, this control unit, which is not illustrated, will preferably be able to close or open the bus shunt bypass switch (S4). However, it is not absolutely necessary to provide such bus master instructions for said control, while it is recommended nonetheless so as to give the bus master (ECU) full control over the state of the bus shunt bypass switches (S4) of the auto-addressable bus nodes (SL1, SL2, SL3). Preferably, the bus master instructions for control of the bus shunt bypass switches (S4) by the bus master (ECU) can be given per instruction to all auto-addressable bus nodes (SL1, SL2, SL3), or as an instruction to a concrete auto-addressable bus node (SL1, SL2, SL3). In the latter case, it is necessary that the respective auto-addressable bus node has a valid bus node address. This can be a previously assigned bus node address or a predetermined default bus node address which then is typically common to all such auto-addressable bus nodes (SL1, SL2, SL3) to which there was not yet assigned a bus node address. Thus, it can also be envisioned that the bus master (ECU) will send an instruction for control of the bus shunt bypass switches (S4) only to those auto-addressable bus nodes (SL1, SL2, SL3) which do not yet have an assigned bus node address. For the data bus system, the time after switch-on can be divided into two basic time sections:

an assignment time period in which an address is assigned to the auto-addressable bus nodes (SL1, SL2, SL3) by way of one of the earlier-mentioned auto addressing methods or the above auto addressing method, and an operating time period in which the data bus is operated normally, in which all bus nodes inclusive of the auto-addressable bus nodes (SL1, SL2, SL3) have a preferably valid and preferably individual bus node address, and in which the auto-addressable bus nodes (SL1, SL2, SL3) behave like standard bus nodes (CS1, CS2).

Preferably, the respective bus shunt bypass switches (S4) of the auto-addressable bus nodes (SL1, SL2, SL3) are closed in the operating time period. Thereby, the similarity in the electric behavior of the auto-addressable bus nodes (SL1, SL2, SL3) in comparison to the standard bus nodes (CS1, CS2) is considerably improved, which will improve the EMC behavior. Notably, it is known from the state of the that, in certain cases, in application within an automobile, a ferrite has to be placed at the bus input and at the bus output of a bus node. By the reduction of the bus resistance due to the virtual abolishment of the bus shunt resistor (R2) because of its bypassing by the bus shunt bypass switch (S4) in the operating time period, there is achieved a substantial improvement of the bus characteristics, and the number of maximally possible bus nodes is increased.

At the start of the assignment time period, preferably all bus shunt bypass switches (S4) are opened. The assignment time period preferably starts with the signaling of the beginning of the address assignment by the bus master to all bus nodes. In so far, the concrete type of this start signal depends on the used concrete auto addressing method on the basis of a bus shunt resistor (R2). Thus, at the latest, the start signal of the bus master (ECU) will open all bus shunt bypass switches (S4) of all auto-addressable bus nodes which have such a bus shunt bypass switch (S4). When a valid bus node address is assigned to an auto-addressable bus node (SL1, SL2, SL3) by means of a bus shunt resistor (R2) and by using one of the known methods for auto addressing, this known auto-addressable bus node will close its bus shunt bypass switch (S4) and will thus bypass the respective bus shunt resistor (R2) for the rest of the assignment time period and the following operating time period. Preferably, it should be possible to terminate this bypass by resetting to the switch-on time or by a software order of the bus master (ECU).

Figure 13:
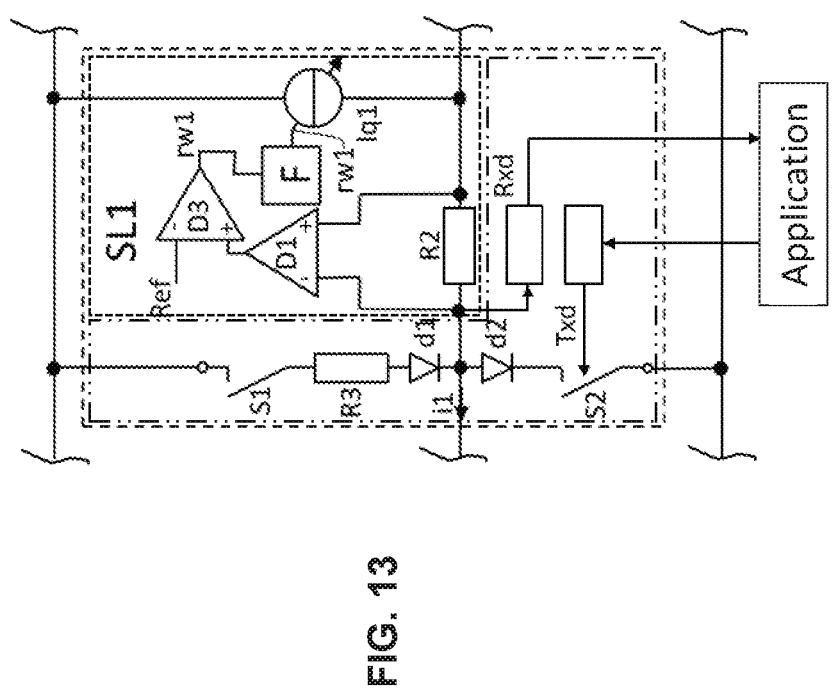

FIG. 13 shows an addressable bus node (SL1) wherein the components belonging to the transceiver are enclosed by chain-dotted lines. The signal (RxD) will be branched off from the bus and, after the processing, is supplied to the actual application (e.g. a window lifter or a seat adjustment) which in turn will send signals to the transceiver that will then be used as response signal (TxD) for control of the transceiver. Enclosed by dots is that portion of the bus node (SL1) which deals with the auto addressing possibility and the inventive feeding of the addressing current into the data bus.

The disclosure can be circumscribed, by way of alternative, by one of the groups of features mentioned hereunder, wherein the groups of features can be combined with each other in any desired manner and also individual features of a group of features can be combined with one or several other features of one or several other groups of features and/or of one or several of the earlier described embodiments.

1. A method for the assigning of bus addresses within a serial data bus comprising a chain of bus nodes (SL1, SL2, SL3) and a bus master (ECU),
  wherein the bus nodes (SL1, SL2, SL3) can be auto-addressable bus nodes or standard bus nodes, and
  wherein the data bus comprises a bus master (ECU), and
  wherein each bus node (SL2, SL3) has a preceding bus node (SL1, SL2) unless it is the first bus node (SL1), and
  wherein each bus node (SL2, SL3) is connected to its preceding bus node (SL1, SL2) by the data bus unless it is the first bus node (SL1), and
  wherein the first bus node (SL1) is connected to the bus master (ECU) by the data bus, and
  wherein each bus node (SL2, SL3) sends a bus node output current (i2, i3) to its preceding bus node (SL1, SL2) via a bus node output unless it is the first bus node (SL1), and
  wherein the first bus node (SL1) sends a bus node output current (i1) to the bus master (ECU) via a bus node output, and
  wherein each bus node (SL1, SL2) receives a bus node input current (i2, i3) from its following bus node (SL2, SL3) via a bus node input unless it is the last bus node (SL3),
  said method comprising the following steps:
  determining the maximum addressing current ($I_{amax}$);
  performing an initialization sequence comprising the following steps for each auto-addressable bus node of the bus nodes (SL1, SL2, SL3) that does not yet have a valid bus node address, until all auto-addressable bus nodes of the bus nodes (SL1, SL2, SL3) have a valid bus node address:
    signaling a to-be-assigned bus address to all auto-addressable bus nodes;
    performing the following steps by all auto-addressable bus nodes (SL1, SL2, SL3), hereunder referred to as respective auto-addressable bus nodes (SLj):
      receiving the respective auto addressing instruction from the bus master (ECU) via the respective auto-addressable bus node (SLj);
      receiving the to-be-assigned bus address from the bus master (ECU) via the respective auto-addressable bus node (SLj);
      switching off optionally existing bus node base current sources (S1, R3, d1) within the respective auto-addressable bus node (SLj);
      receiving a start signal for the assigning of the to-be-assigned bus address from the bus master (ECU) via the respective auto-addressable bus node (SLj), and starting a timer by the respective auto-addressable bus node (SLj);
      feeding the bus input current ($i_{(j+1)}$) received from the subsequent bus nodes (SL(j+1), SL(j+2) . . . ) into the bus node output of the respective auto-addressable bus node (SLj) as a part of the bus output current ($i_j$) of the respective auto-addressable bus node (SLj);
      detecting the value of the bus node output current ($i_j$) of the respective auto-addressable bus node (SLj) with the aid of measurement circuit (R2, D1, D3);
      generating a control signal ($rw_j$) from the detected value of the bus node output current ($i_j$) of the respective auto-addressable bus node (SLj) with the aid of controlling means (F);
      adjusting the bus node output current ($i_j$) through the respective auto-addressable bus node (SLj) by means of a controlled addressing current source (Iqj) whose addressing current is a part of the bus node output current ($i_j$), to a predetermined summated current value ($I_{ref}$) in dependence on the generated control signal (rwj),
      wherein an increase of the addressing current of the controlled auto addressing current source (Iqj) of the respective auto-addressable bus node (SLj) takes place with a first time constant ($\tau_1$), and
      wherein a decrease of the addressing current of the controlled auto addressing current source (Iqj) of the respective auto-addressable bus node (SLj) takes place with a second time constant ($\tau_2$), and
      wherein the second time constant ($\tau_2$) is smaller than the first time constant ($\tau_1$);
      comparing the control value (rj) of the respective auto-addressable bus node (SLj) to a threshold value (SWj) of the respective auto-addressable bus node (SLj);
      freezing the control of the addressing current source (Iqj) of the respective auto-addressable bus node (SLj) at a first time point ($\tau_1$) after the start of the timer;
      taking over the to-be-assigned bus node address from the bus master (ECU) as the valid bus node address of the respective auto-addressable bus node (SLj) when a minimum time has passed since the start of the timer and when the comparison of the control value (rj) to a threshold value (SWj) has the result that the amount of the addressing current of the addressing current source (Iqj) of the respective auto-addressable bus node (SLj) is above a current threshold value, and configuration of the respective auto-addressable bus node (SLj) as a standard bus node without auto addressing capability with the to-be-assigned bus node address as the bus node address of the respective auto-addressable bus node (SLj) at a later time point $t_2$ after the first time point $t_1$, whereby this auto-addressable bus node (SLj) will, for the time being, not participate anymore in the subsequent initialization sequences;
    verifying the successful address assignment by the bus master (ECU);
    optionally, cancellation of the validity of the last assigned bus node address, whereby the respective auto-addressable bus nodes (SLj) behave again like auto-addressable bus nodes (SLj) without valid bus node address;
    examining whether all auto-addressable bus nodes have obtained a valid bus node address;
    performing a further initialization sequence in case that not all auto-addressable bus nodes have obtained a valid bus node address.

2. The method according to item 1, wherein the second time constant ($\tau_2$) is smaller than the first time constant ($\tau_1$) by a factor larger than 10.

3. The method according to one or a plurality of the preceding items, wherein the second time constant ($\tau_2$) within the respective auto-addressable bus node (SLj) is dependent on the value of the bus node output current ($i_j$) detected by measurement circuit (R2, D1, D3)—of the respective auto-addressable bus node (SLj).

4. The method according to one or a plurality of the preceding items, wherein the first time constant ($\tau_1$) within the respective auto-addressable bus node (SLj) is dependent on the value—detected by measurement circuit (R2, D1, D3)—of the bus node output current ($i_j$) of the respective auto-addressable bus node (SLj).

5. The method according to one or a plurality of the preceding items, wherein the first time constant ($\tau_1$) within the respective auto-addressable bus node (SLj) is dependent on the value of the bus node output current (h)—detected by measurement circuit (R2, D1, D3)—of the respective auto-addressable bus node (SLj) in such a manner that the value of the first time constant ($\tau_1$) for the bus node output current ($i_j$) below a threshold value has a first value and for the bus node output current ($i_j$) above the threshold value has a second value.

6. A bus node (SL1, SL2, SL3) for a serial data bus
comprising a bus shunt resistor (R2) which is inserted in the data bus, and
an addressing current source (Iq1, Iq2, Iq3) for detecting the bus position of the bus node in the data bus, which can additionally feed an addressing current into the data bus in a controlled manner to the effect that the total current (i1, i2, i3) through the shunt bus resistor (R2) of the bus node (SL1, SL2, SL3) corresponds to a summated current ($I_{ref}$) which is predetermined or computed or defined in some other manner, and
wherein the addressing current flows through the bus shunt resistor (R2).

7. The bus node according to the preceding item, wherein the bus node comprises measurement circuit (R2, D1) for detecting the current through the shunt bus resistor (R2).

8. The bus node according to any one of the items 6 to 7, wherein the detected current through the shunt bus resistor (R2) is used for a self-test.

9. The bus node according to any one or a plurality of the items 6 to 8, wherein the addressing current source (Iqx1, Iqx2, Iqx3) is operative to increase the addressing current by a first time constant ($\tau_1$) and to lower it by a second time constant ($\tau_2$) which is smaller than the first time constant ($\tau_1$).

10. A method for the assigning of bus addresses within a serial data bus comprising a chain of bus nodes (SL1, SL2, SL3) and a bus master (ECU),
wherein the bus nodes (SL1, SL2, SL3) can be auto-addressable bus nodes or standard bus nodes, and
wherein the data bus comprises a bus master (ECU), and
wherein each bus node (SL2, SL3) has a preceding bus node (SL1, SL2) unless it is the first bus node (SL1), and
wherein each bus node (SL2, SL3) is connected to its preceding bus node (SL1, SL2) by the data bus unless it is the first bus node (SL1), and
wherein the first bus node (SL1) is connected to the bus master (ECU) by the data bus, and
wherein each bus node (SL2, SL3) sends a bus node output current (i2, i3) to its preceding bus node (SL1, SL2) via a bus node output unless it is the first bus node (SL1), and
wherein the first bus node (SL1) sends a bus node output current (i2, i3) to the bus master (ECU) via a bus node output, and
wherein each bus node (SL1, SL2) receives a bus node input current (i2, i3) from its following bus node (SL2, SL3) via a bus node input unless it is the last bus node (SL3),
said method comprising the following steps:
determining the maximum addressing current ($I_{amax}$);
performing an initialization sequence comprising the following steps for each auto-addressable bus node of the bus nodes (SL1, SL2, SL3) that does not yet have a valid bus node address, until all auto-addressable bus nodes of the bus nodes (SL1, SL2, SL3) have a valid bus node address:
signaling that a bus address is to be assigned, to all auto-addressable bus nodes by an auto addressing instruction;
performing the following steps by all auto-addressable bus nodes (SL1, SL2, SL3), hereunder referred to as respective auto-addressable bus nodes (SLj):
receiving the respective auto addressing instruction, particularly from the bus master (ECU), via the respective auto-addressable bus node (SLj);
receiving a start signal for the assigning of the to-be-assigned bus address from the bus master (ECU) via the respective auto-addressable bus node (SLj), and starting a timer by the respective auto-addressable bus node (SLj);
feeding the bus input current ($i_{(j+1)}$) received from the subsequent bus nodes (SL(j+1), SL(j+2)) into the bus node output of the respective auto-addressable bus node (SLj) as a part of the bus output current ($i_j$) of the respective auto-addressable bus node (SLj);
detecting the value of the bus node output current (h) of the respective auto-addressable bus node (SLj) with the aid of measurement circuit (R2, D1, D3);
generating a control signal ($rw_j$) from the detected value of the bus node output current ($i_j$) of the respective auto-addressable bus node (SLj) with the aid of controlling means (F);
adjusting the bus node output current ($i_j$) through the respective auto-addressable bus node (SLj) by means of a controlled auto addressing current source (Iqj) whose addressing current is a part of the bus node output current ($i_j$), to a predetermined summated current value ($I_{ref}$) in dependence on the generated control signal (rwj),
wherein an increase of the addressing current of the controlled auto addressing current source (Iqj) of the respective auto-addressable bus node (SLj) takes place with a first time constant ($\tau_1$); and
wherein a decrease of the addressing current of the controlled auto addressing current source (Iqj) of the respective auto-addressable bus node (SLj) takes place with a second time constant ($\tau_2$); and
wherein the second time constant ($\tau_2$) is smaller than the first time constant ($\tau_1$);
comparing the control value (d) of the respective auto-addressable bus node (SLj) to a threshold value (SWj) of the respective auto-addressable bus node (SLj);
freezing the control of the addressing current source (Iqj) of the respective auto-addressable bus node (SLj) at a first time point ($t_1$) after the start of the timer;
receiving the to-be-assigned bus node address from the bus master (ECU) via the respective auto-addressable bus node (SLj);
taking over the to-be-assigned bus node address from the bus master (ECU) as the valid bus node address of the respective auto-addressable bus node (SLj) when a minimum time has passed since the start of the timer and when the comparison of the control value (rj) to a threshold value (SWj) has the result that the amount of the addressing current of the addressing current source (Iqj) of the respective auto-addressable bus node (SLj) is above a current threshold value, and configuration of the respective auto-addressable bus node (SLj) as a standard bus node without auto addressing capability with the to-be-assigned bus node address as the bus node address of the respective auto-addressable bus node (SLj) at a second time point ($t_2$) after the first time point ($t_1$), whereby this respective auto-addressable bus node (SLj) will, for the time being, not participate anymore in the subsequent initialization sequences;

verifying the successful address assignment by the bus master (ECU);

optionally, cancellation of the validity of the last assigned bus node address, whereby the respective auto-addressable bus nodes (SLj) behave again like auto-addressable bus nodes (SLj) without valid bus node address;

examining whether all auto-addressable bus nodes have obtained a valid bus node address;

performing a further initialization sequence in case that not all auto-addressable bus nodes have obtained a valid bus node address.

11. The method according to item 10, comprising performing the following step by at least a part of the auto-addressable bus nodes (SL1, SL2, SL3), hereunder referred to as a respective auto-addressable bus node (SLj):

switching off optionally existing bus node base current sources (S1, R3, d1) within the respective auto-addressable bus node (SLj).

12. The method according to any one or a plurality of the items 10 to 11, wherein the second time constant ($\tau_2$) is smaller than the first time constant ($\tau_1$) by a factor larger than 10.

13. The method according to any one or a plurality of the items 10 to 12, wherein the second time constant ($\tau_2$) within the respective auto-addressable bus node (SLj) is dependent on the value of the bus node output current ($i_j$)—detected by measurement circuit (R2, D1, D3)—of the respective auto-addressable bus node (SLj).

14. The method according to one or a plurality of the items 10 to 13, wherein the first time constant ($\tau_1$) within the respective auto-addressable bus node (SLj) is dependent on the value—detected by measurement circuit (R2, D1, D3)—of the bus node output current ($i_j$) of the respective auto-addressable bus node (SLj).

15. The method according to one or a plurality of the items 10 to 14, wherein the first time constant ($\tau_1$) within the respective auto-addressable bus node (SLj) is dependent on the value of the bus node output current ($i_j$)—detected by measurement circuit (R2, D1, D3)—of the respective auto-addressable bus node (SLj) in such a manner that the value of the first time constant ($\tau_1$) for a value of the bus node output current ($i_j$) below a threshold value has a first value and for a value of the bus node output current ($i_j$) above the threshold value has a second value.

16. The method according to one or a plurality of the items 10 to 15, comprising the additional step of examining the detected value of the bus node output current ($i_j$) of the respective auto-addressable bus node (SLj) for plausibility, and initiating measures if the detected value of the bus node output current ($i_j$) of the respective auto-addressable bus node (SLj) is not plausible.

17. The method according to the preceding item, comprising the additional step of newly defining the infeed point of the addressing current if the detected value of the bus node output current ($i_j$) of the respective auto-addressable bus node (SLj) is not plausible.

18. The method according to one or a plurality of the items 10 to 17, comprising the additional step of signaling of an error via the data bus upon request by a bus master (ECU) if the detected value of the bus node output current ($i_j$) of the respective auto-addressable bus node (SLj) is not plausible.

19. The method according to one or a plurality of the items 10 to 18, comprising the additional step of performing the step of detecting the value of the bus node output current ($i_j$) of the respective auto-addressable bus node (SLj) with the aid of measurement circuit (R2, D1, D3) as:

detection of the value of the bus node output current ($i_j$) of the respective auto-addressable bus node (SLj) with the aid of measurement circuit (R2, D1, D3) with a first sign if the detected value of the bus node output current ($i_j$) of the respective auto-addressable bus node (SLj) is plausible, and detection of the value of the bus node output current ($i_j$) of the respective auto-addressable bus node (SLj) with the aid of measurement circuit (R2, D1, D3) with a second sign that is inverse to the first sign if the detected value of the bus node output current ($i_j$) of the respective auto-addressable bus node (SLj) is plausible.

20. The method according to one or a plurality of the items 10 to 19, comprising the additional step of using an error address as a valid bus node address of the respective auto-addressable bus node (SLj) if the detected value of the bus node output current ($i_j$) of the respective auto-addressable bus node (SLj) is not plausible.

21. A bus node (SL1, SL2, SL3) for a serial data bus comprising a bus shunt resistor (R2) which is inserted in the data bus, and comprising an addressing current source (Iq1, Iq2, Iq3, Iqx) for detecting the bus position of the bus node in the data bus, which can additionally feed an addressing current into the data bus in a controlled manner to the effect that the total current (i1, i2, i3, ix) through the shunt bus resistor (R2) of the bus node (SL1, SL2, SL3, SLx) corresponds to a summated current ($I_{ref}$) which is predetermined or computed or defined in some other manner, and wherein the addressing current of the addressing current source (Iq1, Iq2, Iq3, Iqx) of the bus node is provided to flow through the bus shunt resistor (R2) during normal operation.

22. The bus node according to the preceding item, wherein the bus node comprises measurement circuit (R2, D1) for detecting the current through the shunt bus resistor (R2).

23. The bus node according to any one of the items 20 to 22, wherein the detected current through the shunt bus resistor (R2) is used for a self-test.

24. The bus node according to any one of the items 20 to 23, comprising a detection device (DET) which is operative to detect internal signals (ds1, ds3) of the bus node (SLx) for plausibility.

25. The bus node according to any one of the items 20 to 24, wherein the bus node (SLx) or a partial device (DET) of the bus node (SLx) is operative to take measures if the detection device (DET) does not detect plausible internal signals within the bus node.

26. The bus node according to any one of the items 20 to 25, wherein the bus node comprises a partial device (MUX) which can change the infeed point of the addressing current of the addressing current source (Iqx).

27. The bus node according to any one of the items 20 to 26,
wherein the bus node comprises, instead of an addressing current source (Iq1, Iq2, Iq3, Iqx), a first addressing current source (Iqx1) and a second addressing current source (Iqx2), and
wherein the first addressing current source (Iqx1), when feeding current, feeds its current into a node connected to the first connecting point of the bus shunt resistor (R2), and
wherein the second addressing current source (Iqx2), when feeding current, feeds its current into a node connected to the second connecting point of the bus shunt resistor (R2), and
wherein the two addressing current sources (Iqx1, Iqx2) feed their currents in such a manner that the addressing current is caused to flow through the bus shunt resistor (R2).

28. The bus node according to any one of the items 20 to 27, wherein the addressing current source (Iqx1, Iqx2, Iqx3) is operative to increase the addressing current by a first time constant ($\tau_1$) and to lower it by a second time constant ($\tau_2$) which is smaller than the first time constant ($\tau_1$).

29. A method for the assigning of bus addresses within a serial data bus comprising a chain of bus nodes (SL1, SL2, SL3) and a bus master (ECU),
wherein the bus nodes (SL1, SL2, SL3) can be auto-addressable bus nodes or standard bus nodes, and
wherein the data bus comprises a bus master (ECU), and
wherein each bus node (SL2, SL3) has a preceding bus node (SL1, SL2) unless it is the first bus node (SL1), and
wherein each bus node (SL2, SL3) is connected to its preceding bus node (SL1, SL2) by the data bus unless it is the first bus node (SL1), and
wherein the first bus node (SL1) is connected to the bus master (ECU) by the data bus, and
wherein each bus node (SL2, SL3) sends a bus node output current (i2, i3) to its preceding bus node (SL1, SL2) via a bus node output unless it is the first bus node (SL1), and
wherein the first bus node (SL1) sends a bus node output current (i1) to the bus master (ECU) via a bus node output, and
wherein each bus node (SL1, SL2) receives a bus node input current (i2, i3) from its following bus node (SL2, SL3) via a bus node input unless it is the last bus node (SL3),
said method comprising the following steps:
including one assigned bus shunt resistor (R2) per auto-addressable bus node (SL1, SL2, SL3), which is a part of the respective auto-addressable bus node (SL1, SL2, SL3), into the serial data bus, particularly by opening a bus shunt bypass switch (S4) within the respective auto-addressable bus node (SL1, SL2, SL3) which is assigned to the assigned bus shunt resistor (R2);
detection and assignment of a bus address for at least one of the auto-addressable bus nodes (SL1, SL2, SL3), the newly addressed auto-addressable bus node (SL1, SL2, SL3), with the aid of the assigned bus shunt resistors (R2) which are not bypassed by their assigned bus shunt bypass switch (S4);
bypassing the assigned bus shunt resistor (R2) of the newly addressed auto-addressable bus node (SL1, SL2, SL3) by closing the bus shunt bypass switch (S4) which is assigned to the assigned bus shunt resistor (R2) of the newly addressed auto-addressable bus node (SL1, SL2, SL3), wherein the newly addressed auto-addressable bus node (SL1, SL2, SL3), after the assignment of the bus address to the newly addressed auto-addressable bus node (SL1, SL2, SL3) and the closing of its assigned bus shunt bypass switch (S4), will behave like a standard bus node until an event which will terminate this behavior of the newly addressed auto-addressable bus node (SL1, SL2, SL3);
optionally, repeating the detection and assignment of bus node address for at least one further auto-addressable bus node (SL1, SL2, SL3) and optionally bypassing the assigned bus shunt resistor (R2) of the further newly addressed auto-addressable bus node (SL1, SL2, SL3) by means of the assigned bus shunt bypass switch (S4) until optionally all auto-addressable bus nodes (SL1, SL2, SL3) have received a bus node address.

30. A bus node which is capable of performing a method for the assigning of bus node addresses to bus nodes of a serial data bus,
wherein the method for the assigning of bus addresses to bus nodes of a serial data bus system is performed with the aid of bus shunt resistors (R2) in the individual bus nodes (SL1, SL2, SL3) in an assignment time period and
wherein, after to the method for the assigning of bus node addresses to the bus nodes of the serial data bus system in the assignment time period, there follows an operating time period, and
wherein the bus node comprises such a bus shunt resistor (R2), characterized in that
it comprises a bus shunt bypass switch (S4)
which, prior to assigning a bus node address to the bus node in the assignment time period is opened, and
which after the assignment of bus node address to the bus node in the assignment time period is closed, and
which is closed in the operating time period.

31. A method for control of a serial data bus system which comprises a bus master connected to a bus line, and a plurality of bus nodes serially connected to the bus line, wherein some of said bus nodes are addressable bus nodes and others can be designed as standard bus nodes having an already fixed address,
wherein the method includes inter alia an addressing phase for assignment of addresses to at least some of the bus nodes, and an operating phase for operating the data bus system after termination of the addressing phase,
wherein, in the addressing phase, at least some of the bus nodes are operative to feed into the bus line a respective current flowing to the bus master (ECU), and
one of the bus nodes is the first bus node, connected to the bus line at a site closest to the bus master (ECU), and the other bus nodes are connected to the bus line at sites upstream of the first bus node, and one of the bus nodes is the last bus node, connected to the bus line at a site most remote from the bus master (ECU), and the other bus nodes are connected to the bus line at sites downstream of said last bus node between said bus node and the bus master, and at least two of the bus nodes are addressable bus nodes (SL1, SL2, SL3, SLx), each of which comprises a current measurement circuit (R2) adapted to be switched into the bus line and a controllable bypass switch (S4) connected in parallel to said current measurement circuit (R2), and to which a respective address is assigned by the bus master (ECU) in the addressing phase, and further bus nodes can be standard bus nodes (CS1, CS2) having a respective address that is fixed already before performing the addressing phase, wherein, in said method, in the addressing phase, an address is assigned to each addressable bus node (SL1, SL2, SL3, SLx) in the opened state of the bypass switch (S4), and in the operating phase, the current measurement circuit (R2) of each addressed addressable bus node (SL1, SL2, SL3, SLx) is bypassed by closing the bypass switch (S4).

32. The method according to item 31, characterized in that the addressing phase comprises a plurality of addressing cycles, wherein, per address cycle, an address is assigned to respectively one of the addressable bus nodes (SL1, SL2, SL3, SLx) that have not or not yet been addressed, and that an addressable bus node (SL1, SL2, SL3, SLx) that has been addressed in an addressing cycle will, from then on, not participate anymore in the further address assigning for other not-yet-addressed addressable bus participants, wherein the current measurement circuit (R2) which in the addressing phase has been assigned to an already addressed addressable bus node (SL1, SL2, SL3, SLx) is bypassed by closing the bypass switch (S4) connected in parallel to the current measurement circuit (R2).

33. The method according to items 31 or 32, characterized in that, in the addressing phase, each addressable bus node (SL1, SL2, SL3, SLx) that has not or not yet been addressed is operative to feed into the bus line an addressing current flowing to the bus master (ECU), said addressing current flowing through the current measurement circuit (R2) of the respective addressable bus node (SL1, SL2, SL3, SLx) that has not or not yet been addressed.

34. The method according to any one of items 31 to 33, characterized in that the current measurement circuit (R2) is a shunt resistor.

35. An addressable bus node for a serial data bus system comprising a bus master connected to a bus line and comprising a plurality of bus nodes serially connected to the bus line, wherein some of the bus nodes are addressable bus nodes and others can be designed as standard bus nodes (CS1, CS2) with already fixed address, said addressable bus node being adapted to have its address assigned to it by the bus master and comprising:

a current measurement circuit (R2) adapted to be switched into the bus line, a bypass switch (R4) connected in parallel to the current measurement circuit (R2), an addressing current source for feeding into the bus line an addressing current flowing the bus master (ECU), and a control unit for controlling the bypass switch (S4), wherein the control unit is operative, in an addressing phase of the data bus system, to control the bypass switch (S4) to assign an address to assume the opened state, and, in an operative phase of the data bus system occurring after termination of the addressing phase, is operative to control the bypass switch to assume the closed state.

36. The addressable bus node according to item 35, characterized in that the current measurement circuit is operative to detect inter alia the addressing current fed from the addressing current source into the bus line.

LIST OF REFERENCE NUMERALS

CS1 standard bus node
CS2 standard bus node
D1 first differential amplifier
d1 first polarity reversal protection diode
D2 second differential amplifier
d2 second polarity reversal protection diode
D3 third differential amplifier
DET detection device
ds1 output of first differential amplifier (D1)
ds2 output of second differential amplifier (D2)
ds3 output of third differential amplifier (D3)
ECU bus master
er error signal to bus-node-internal optional processor
F non-linear filter of auto-addressable bus node (SL1, SL2, SL3)
Iq1 controlled addressing current source of the first auto-addressable bus node (SL1), delivering the addressing current of the first auto-addressable bus node (SL1)
i1 bus node output current of the first auto-addressable bus node (SL1)
Iq2 controlled addressing current source of the second auto-addressable bus node (SL2), delivering the addressing current of the second auto-addressable bus node (SL2)
i2 bus node output current of the second auto-addressable bus node (SL2)
i2R bus shunt current through the bus shunt resistor (R3) of the second auto-addressable bus node (SL2)
Iq3 controlled addressing current source of the third auto-addressable bus node (SL3), delivering the addressing current of the third auto-addressable bus node (SL3)
i3 bus node output current of the third auto-addressable bus node (SL3)
Iqx controlled addressing current source of the x-th auto-addressable bus node (SLx), delivering the addressing current of the x-th auto-addressable bus node (SLx)
ix bus node output current of the x-th auto-addressable bus node (SLx)
ixR bus shunt current through the bus shunt resistor (R2) of the x-th auto-addressable bus node (SLx)
$I_{ref}$ predetermined summarized current for the bus node output currents
pol signal by which the detection device (DET) reverses the polarity of the two inputs of the first differential amplifier (D1) or the polarity of the output of the first differential amplifier (D1) if the examination for plausibility does not result in plausible internal signals (ds1, ds3)
R1 auxiliary shunt resistor of an auto-addressable bus node (SL1, SL2, SL3)
R2 bus shunt resistor of an auto-addressable bus node (SL1, SL2, SL3)
R3 slave pull-up resistor
Rec receiver
Ref reference value
rw1 control value of the first auto-addressable bus node (SL1)

rw2 control value of the second auto-addressable bus node (SL2)
rw3 control value of the third auto-addressable bus node (SL3)
rwx control value of the x-th auto-addressable bus node (SLX)
S1 first switch of an auto-addressable bus node (SL1, SL2, SL3)
S2 second switch of an auto-addressable bus node (SL1, SL2, SL3)
S3 third switch of an auto-addressable bus node (SL1, SL2, SL3)
S4 bus shunt bypass switch of an auto-addressable bus node (SL1, SL2, SL3)
SB switch
SL1 first auto-addressable bus node
SL2 second auto-addressable bus node
SL3 third auto-addressable bus node
SLx x-th auto-addressable bus node
$V_{R2}$ voltage drop across the bus shunt resistor (R2) of the respective auto-addressable bus node (SL1, SL2, SL3)

The invention claimed is:

1. A method for controlling a serial data bus system comprising:
a bus line;
a bus master connected to the bus line; and
a plurality of bus nodes serially connected to the bus line;
   wherein the plurality of bus nodes includes:
   at least two addressable bus nodes configured to receive addresses in an addressing phase; and
   zero or more standard bus nodes having respectively already fixed addresses;
wherein the method includes the addressing phase for assigning addresses to at least one of the at least two addressable bus nodes, and an operating phase for operating the serial data bus system after termination of the addressing phase;
wherein, in the addressing phase, at least two of the plurality of bus nodes are operative to feed into the bus line a respective current flowing to the bus master, and the plurality of bus nodes includes:
   a first bus node, connected to the bus line at a site upstream from, and closest to the bus master;
   a last bus node, connected to the bus line at a site upstream from, and farthest from the bus master; and
   zero or more middle bus nodes, connected to the bus line in between the first bus node and the last bus node;
wherein:
   each of the at least two addressable bus nodes is configured to receive a respective address assigned from the bus master during the addressing phase and comprises a respective current measurement circuit adapted to be switched into the bus line and a respective controllable bypass switch connected in parallel to the respective current measurement circuit, and,
   each of the zero or more standard bus nodes has the respective address that is fixed prior to performing the addressing phase,
wherein, in the method;
   in the addressing phase, the respective address is assigned to the at least one of the at least two addressable bus nodes in an open state of the respective controllable bypass switch, and
   in the operating phase, the respective current measurement circuit of the at least one addressed addressable bus node is bypassed by closing the respective controllable bypass switch.

2. The method according to claim 1, wherein the addressing phase comprises a plurality of addressing cycles, and, for each of the addressing cycles:
   an address is assigned respectively to one of the addressable bus nodes that has not yet been assigned an address; and
   the one of the addressable bus nodes, after the address is assigned, will, for a remainder of the addressing phase, not participate in further address assigning for other not-yet-addressed addressable bus nodes, and further wherein, for the one of the addressable bus nodes, after the address is assigned, the current measurement circuit is bypassed by closing the bypass switch connected in parallel to the current measurement circuit.

3. The method according to claim 1, wherein, in the addressing phase, each addressable bus node that has not yet been assigned an address during the addressing phase is operative to feed into the bus line a respective address current flowing to the bus master, the respective address current flowing through the current measurement circuit of the respective addressable bus node that has not yet been assigned an address.

4. The method according to claim 2, wherein, in the addressing phase, each addressable bus node that has not yet been assigned an address during the addressing phase is operative to feed into the bus line a respective address current flowing to the bus master, the respective address current flowing through the current measurement circuit of the respective addressable bus node that has not yet been assigned an address.

5. The method according to claim 1, wherein the current measurement circuit includes a shunt resistor.

6. The method according to claim 2, wherein the current measurement circuit includes a shunt resistor.

7. The method according to claim 3, wherein the current measurement circuit includes a shunt resistor.

8. The method according to claim 4, wherein the current measurement circuit includes a shunt resistor.

9. An addressable bus node for a serial data bus system, the serial data bus system comprising:
a bus line;
a bus master connected to the bus line; and
a plurality of bus nodes serially connected to the bus line;
   wherein the plurality of bus nodes includes:
at least two addressable bus nodes configured to receive addresses assigned by the bus master in an addressing phase; and
zero or more standard bus nodes having respectively an already fixed address: each of the at least two addressable bus nodes comprising:
   a respective current measurement circuit adapted to be switched into the bus line;
   a respective bypass switch connected in parallel to the current measurement circuit;
   a respective addressing current source for feeding into the bus line an address current flowing into the bus master; and
   a respective control unit for controlling the respective bypass switch;
      wherein, in an addressing phase of the serial data bus system for assignment of an address, the respective control unit is programmed to control the respective bypass switch to assume an open state, and, in an operative phase of the serial data bus system occurring after termination of the addressing phase, the respective control unit is operative to control the respective bypass switch to assume a closed state.

10. The addressable bus node according to claim 9, wherein the respective current measurement circuit is operative to capture the address current fed from the respective addressing current source into the bus line.

* * * * *